United States Patent
Yun et al.

(10) Patent No.: US 10,446,626 B2
(45) Date of Patent: Oct. 15, 2019

(54) ORGANIC LIGHT EMITTING DIODE DISPLAY DEVICE AND MANUFACTURING METHOD THEREOF

(71) Applicant: SAMSUNG DISPLAY CO., LTD., Yongin-si, Gyeonggi-do (KR)

(72) Inventors: Haeyoung Yun, Yongin-si (KR); Junghyun Cho, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/828,630

(22) Filed: Dec. 1, 2017

(65) Prior Publication Data

US 2018/0158887 A1    Jun. 7, 2018

(30) Foreign Application Priority Data

Dec. 7, 2016  (KR) .......................... 10-2016-0165785

(51) Int. Cl.
| | | |
|---|---|---|
| *H01L 27/32* | (2006.01) | |
| *G09G 3/30* | (2006.01) | |
| *H01L 51/10* | (2006.01) | |
| *H01L 51/52* | (2006.01) | |

(52) U.S. Cl.
CPC .......... *H01L 27/3246* (2013.01); *G09G 3/30* (2013.01); *H01L 27/3258* (2013.01); *H01L 51/107* (2013.01); *H01L 51/5203* (2013.01); *H01L 51/5209* (2013.01); *H01L 51/5265* (2013.01); *H01L 51/525* (2013.01); *H01L 51/5225* (2013.01)

(58) Field of Classification Search
CPC ............ H01L 27/3276; H01L 27/3246; H01L 27/3258; H01L 27/3262; H01L 51/5237; H01L 51/56; H01L 51/0017; H01L 21/76224; G09G 3/3233; G09G 3/30
See application file for complete search history.

(56) References Cited

U.S. PATENT DOCUMENTS

| | | |
|---|---|---|
| 9,287,526 B2 | 3/2016 | Miyazawa et al. |
| 9,577,208 B2 | 2/2017 | Lee et al. |
| 2005/0046342 A1* | 3/2005 | Park .................... H01L 27/3246 |
| | | 313/504 |
| 2006/0033429 A1 | 2/2006 | Fujimura et al. |

(Continued)

FOREIGN PATENT DOCUMENTS

| | | |
|---|---|---|
| JP | 2008-235605 A | 10/2008 |
| KR | 10-2011-0087433 A | 8/2011 |

(Continued)

*Primary Examiner* — Gerald Johnson
(74) *Attorney, Agent, or Firm* — Lewis Roca Rothgerber Christie LLP

(57) ABSTRACT

An organic light emitting diode display device includes a passivation layer, a first electrode, a pixel defining layer, an organic emitting layer, and a second electrode. The passivation layer includes a trench and a recessed portion. The first electrode is on the passivation layer. The pixel defining layer is on the passivation layer and defines an opening which exposes at least a part of the first electrode. The organic light emitting layer is on the first electrode. The second electrode is on the light emitting layer. The recessed portion overlaps the opening and is spaced apart from an edge of the opening. The trench is spaced apart from the first electrode.

27 Claims, 23 Drawing Sheets

(56) References Cited

U.S. PATENT DOCUMENTS

| | | | |
|---|---|---|---|
| 2006/0091399 A1* | 5/2006 | Lee | H01L 27/12 257/72 |
| 2006/0220016 A1 | 10/2006 | Lee et al. | |
| 2008/0024402 A1 | 1/2008 | Nishikawa et al. | |
| 2009/0026445 A1* | 1/2009 | Noh | H01L 51/0541 257/40 |
| 2010/0060148 A1 | 3/2010 | Hwang et al. | |
| 2010/0320453 A1* | 12/2010 | Tanaka | H01L 51/0541 257/40 |
| 2013/0075734 A1* | 3/2013 | Cain | H01L 51/0022 257/57 |
| 2014/0061593 A1 | 3/2014 | Liu, Jr. et al. | |
| 2014/0151651 A1 | 6/2014 | Jin et al. | |
| 2015/0022495 A1* | 1/2015 | Bussat | G06F 3/044 345/174 |
| 2015/0064915 A1* | 3/2015 | Wuister | G03F 7/0002 438/700 |
| 2015/0188088 A1* | 7/2015 | Kubota | H01L 51/5268 257/40 |
| 2016/0087210 A1 | 3/2016 | Stromer et al. | |
| 2016/0104756 A1 | 4/2016 | Lee et al. | |
| 2017/0005286 A1 | 1/2017 | Yun et al. | |
| 2018/0061907 A1* | 3/2018 | Kim | H01L 27/3213 |
| 2018/0069194 A1* | 3/2018 | Ono | H01L 51/5253 |
| 2018/0120623 A1* | 5/2018 | Shiina | G02F 1/13452 |
| 2018/0151643 A1* | 5/2018 | Lee | H01L 27/322 |
| 2018/0212198 A1 | 7/2018 | Inoue et al. | |
| 2019/0006626 A1 | 1/2019 | Kim et al. | |

FOREIGN PATENT DOCUMENTS

| | | |
|---|---|---|
| KR | 10-2013-0095645 A | 8/2013 |
| KR | 10-2014-0072711 A | 6/2014 |
| KR | 10-2015-0039112 A | 4/2015 |
| KR | 10-2016-0042322 A | 4/2016 |
| KR | 10-2016-0066112 A | 6/2016 |
| KR | 10-2016-0080834 A | 7/2016 |
| KR | 10-2017-0005272 A | 1/2017 |
| TW | I297210 B | 5/2008 |

* cited by examiner

ORGANIC LIGHT EMITTING DIODE DISPLAY DEVICE AND MANUFACTURING METHOD THEREOF

CROSS-REFERENCE TO RELATED APPLICATION

Korean Patent Application No. 10-2016-0165785, filed on Dec. 7, 2016, and entitled, "Organic Light Emitting Diode Display Device and Manufacturing Method Thereof," is incorporated by reference herein in its entirety.

BACKGROUND

1. Field

One or more embodiments described herein relate to an organic light emitting diode display device and a method for manufacturing such a display device.

2. Description of the Related Art

An organic light emitting diode display device has low power consumption, high luminance, and high reaction speed. Such a display device has pixels with a multi-layer structure that includes organic light emitting diodes. However, such a structure may produce a color shift that may degrade display quality

SUMMARY

In accordance with one or more embodiments, an organic light emitting diode display device includes a substrate; a passivation layer on the substrate and including a trench and a recessed portion; a first electrode on the passivation layer; a pixel defining layer on the passivation layer, the pixel defining layer defining an opening which exposes at least a part of the first electrode; an organic light emitting layer on the first electrode; and a second electrode on the light emitting layer, wherein the recessed portion overlaps the opening and is spaced apart from an edge of the opening and wherein the trench is spaced apart from the first electrode.

The trench may enclose at least a part of the first electrode. The trench may include a plurality of recessed patterns spaced apart from each other and partially enclosing the first electrode. The trench may be spaced apart from the first electrode by a distance in a range from about 1 μm to about 5 μm. The trench may have a width in a range from about 1.0 μm to about 3.0 μm. The trench may have a depth in a range from about 0.2 μm to about 1.0 μm.

The passivation layer may have substantially a same height with respect to a surface of the substrate at a boundary at which the passivation layer overlaps the pixel defining layer. The passivation layer may have a height difference of about 0.1 μm or less with respect to a surface of the substrate at a boundary at which the passivation layer overlaps the pixel defining layer. The edge of the opening may have substantially a same height with respect to a surface of the substrate. The edge of the opening may have a height difference of about 0.1 μm or less with respect to a surface of the substrate.

The recessed portion may be spaced apart from the edge of the opening by a distance in a range from about 0.5 μm to about 5.0 μm. At least a part of an edge of the recessed portion may be parallel to the edge of the opening. The recessed portion may have a width in a range from about 1.0 μm to about 2.0 μm. The recessed portion may have a depth in a range from about 0.3 μm to about 0.7 μm.

The passivation layer may include a plurality of recessed portions. Each of the plurality of recessed portions may have a linear planar shape. The plurality of recessed portions may be parallel to each other. The recessed portions may be arranged in a radial manner. The plurality of recessed portions may have different depths.

The display device may include a thin film transistor between the substrate and the passivation layer; and one or more wirings connected to the thin film transistor, wherein at least one of the plurality of recessed portions overlaps the one or more wirings and wherein the recessed portion overlapping the one or more wirings has a depth less than a depth of a recessed portion not overlapping the one or more wirings. The one or more wirings may include a data line, a driving voltage line, and a capacitor. The display device may include a spacer on the pixel defining layer.

In accordance with one or more other embodiments, a method for manufacturing an organic light emitting diode display device includes forming a photosensitive material layer by applying a photosensitive material layer on a substrate; patterning the photosensitive material layer to form a passivation layer including a trench and a recessed portion; forming a first electrode on the passivation layer; forming a pixel defining layer on the passivation layer, the pixel defining layer defining an opening for exposing at least a part of the first electrode; forming a light emitting layer on the first electrode; and forming a second electrode on the light emitting layer, wherein the recessed portion overlaps the opening and is spaced apart from an edge of the opening and wherein the trench is spaced apart from the first electrode.

Forming the passivation layer may include thermally curing the patterned photosensitive material layer after patterning the photosensitive material layer. The recessed portion and trench may be defined in a same process. The first electrode may be spaced from the trench by a distance in a range from about 1 μm to about 5 μm. The passivation layer may have substantially a same height with respect to a surface of the substrate at a boundary at which the passivation layer overlaps the pixel defining layer.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
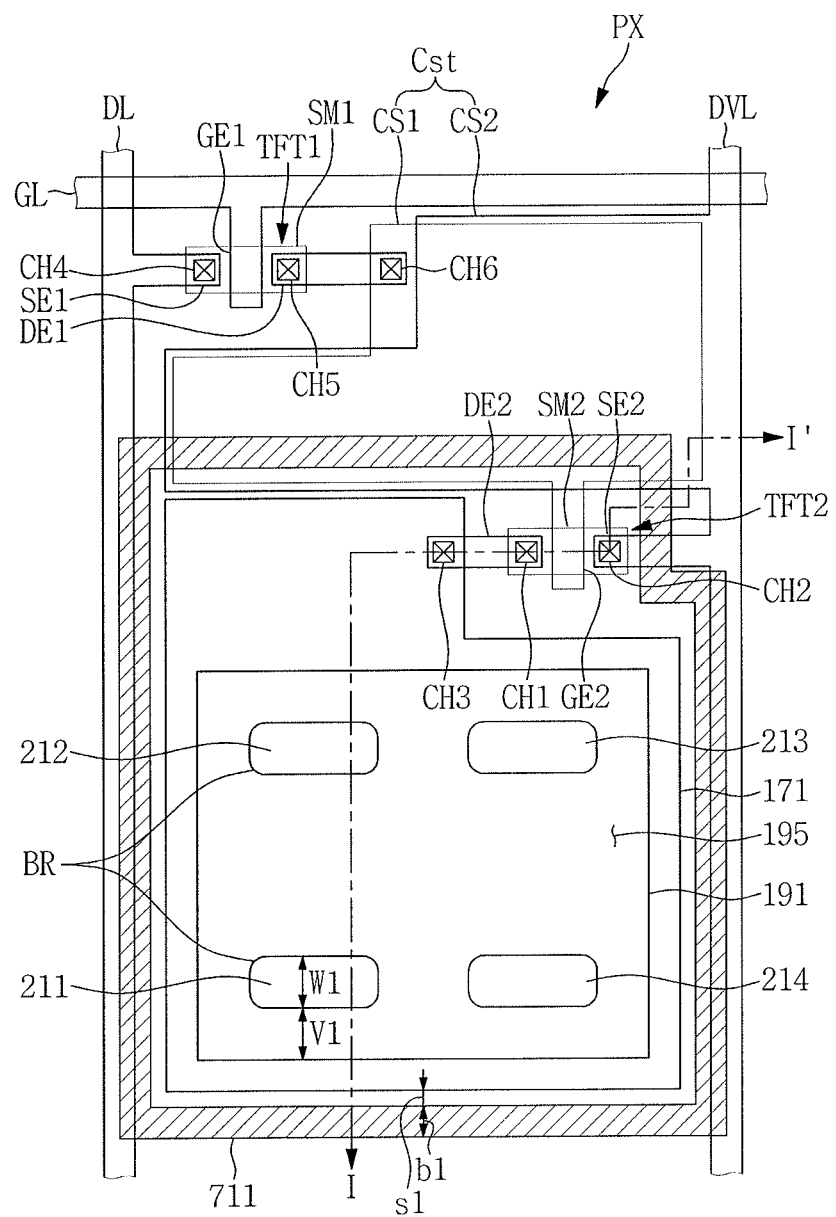
FIG. 1 illustrates a layout embodiment of a pixel.

Example embodiments are described with reference to the drawings; however, they may be embodied in different forms and should not be construed as limited to the embodiments set forth herein. Rather, these embodiments are provided so that this disclosure will be thorough and complete, and will convey exemplary implementations to those skilled in the art. The embodiments (or portions thereof) may be combined to form additional embodiments In the drawings, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

When an element is referred to as being "connected" or "coupled" to another element, it can be directly connected or coupled to the another element or be indirectly connected or coupled to the another element with one or more intervening elements interposed therebetween. In addition, when an element is referred to as "including" a component, this indicates that the element may further include another component instead of excluding another component unless there is different disclosure.

"About," "approximately," or "substantially," as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "About," "approximately," or "substantially," may mean within one or more standard deviations, or within ±30%, 20%, 10%, 5% of the stated value.

Figure 2:
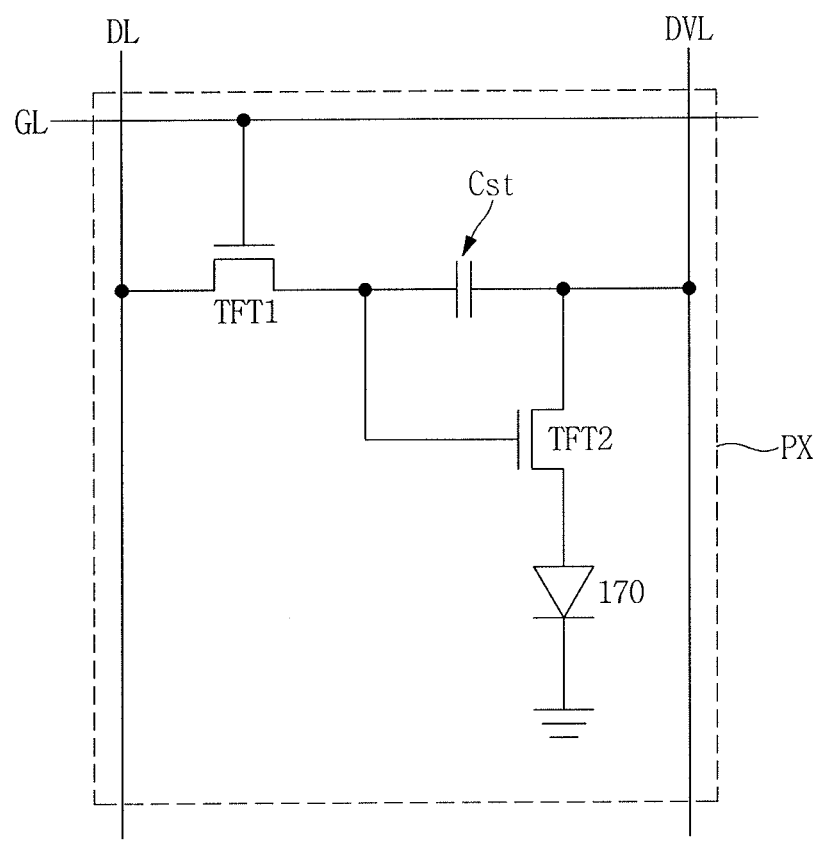
FIG. 2 illustrates a circuit embodiment of the pixel.
Figure 3:
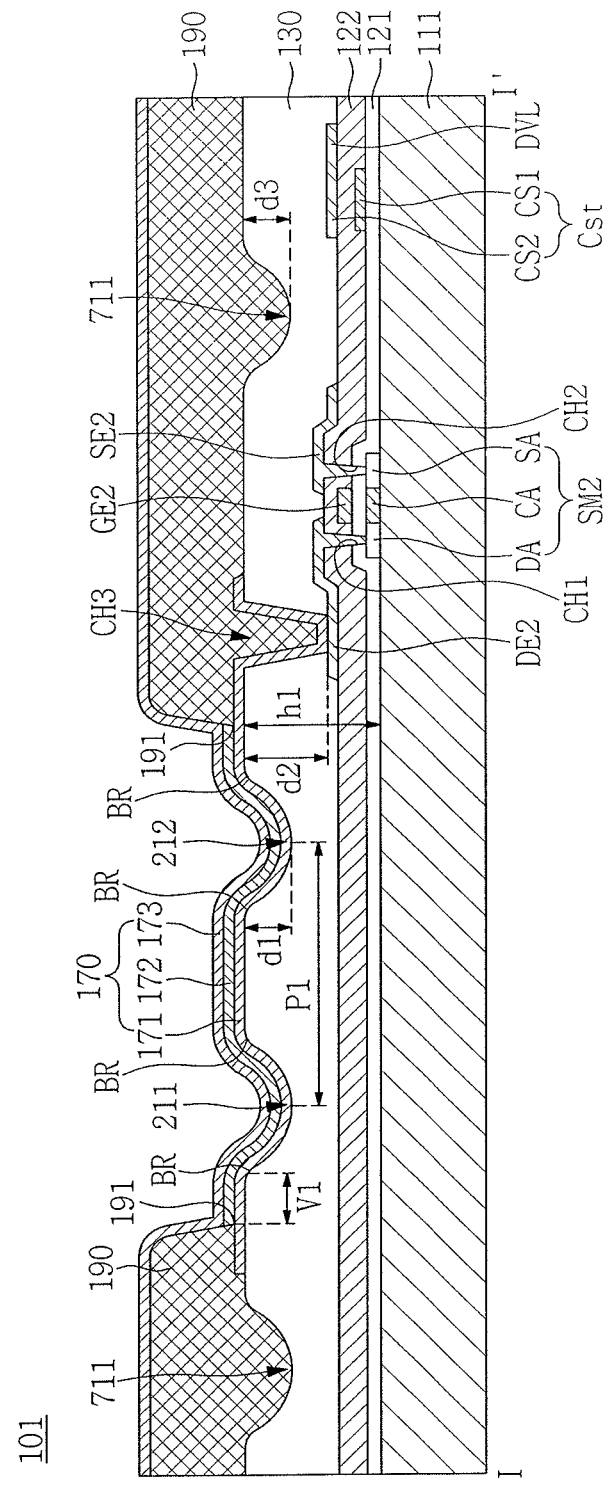
FIG. 3 illustrates a cross-sectional view taken along line I-I' in FIG. 1.

FIG. 1 illustrates a layout embodiment of a pixel PX of an organic light emitting diode (OLED) display device 101. FIG. 2 illustrates a circuit embodiment of the pixel PX. FIG. 3 illustrates a cross-sectional view taken along line I-I' in FIG. 1. The OLED display device 101 includes a plurality of pixels PX. (A pixel PX may refer, for example, to a smallest unit for displaying an image).

Referring to FIGS. 1, 2, and 3, the pixel PX includes a switching thin film transistor TFT1, a driving thin film transistor TFT2, an OLED 170, and a capacitor Cst. The pixel PX may generate a light of a predetermined color, for example, red, green, or blue, cyan, magenta, yellow, white, or another color.

The pixel PX is connected to a gate line GL, a data line DL, and a driving voltage line DVL. The gate line GL extends in one direction. The data line DL extends in another direction crossing the gate line GL. Referring to FIG. 1, the driving voltage line DVL extends in a direction substantially the same as a direction in which the data line DL extends. The gate line GL transmits a scan signal, the data line DL transmits a data signal, and the driving voltage line DVL transmits a driving voltage.

The thin film transistors TFT1 and TFT2 may include the driving thin film transistor TFT2 for controlling the OLED 170 and the switching thin film transistor TFT1 for switching the driving thin film transistor TFT2. While each pixel PX in this embodiment has two thin film transistors TFT1 and TFT2, each pixel PX may have a different number of thin film transistors and/or capacitors in another embodiment, e.g., one thin film transistor and one capacitor or three or more thin film transistors and two or more capacitors.

A portion at which the thin film transistors TFT1 and TFT2, the gate line GL, the data line DL, the driving voltage line DVL and the capacitor Cst are arranged may be referred to as a wiring portion. Each of the gate line GL, the data line DL, the driving voltage line DVL, and the capacitor Cst may be referred to as a wiring. In addition, the thin film transistors TFT1 and TFT2 may be one of the wirings or a part of the wirings.

The switching thin film transistor TFT1 includes a first gate electrode GE1, a first source electrode SE1, a first drain electrode DE1, and a first semiconductor layer SM1. The first gate electrode GE1 is connected to the gate line GL and the first source electrode SE1 is connected to the data line DL.

The first drain electrode DE1 is connected to a first capacitor plate CS1 through a fifth contact hole CH5 and a sixth contact hole CH6. The switching thin film transistor TFT1 transmits a data signal applied to the data line DL to the driving thin film transistor TFT2 according to a scan signal applied to the gate line GL.

The driving thin film transistor TFT2 includes a second gate electrode GE2, a second source electrode SE2, a second drain electrode DE2, and a second semiconductor layer SM2. The second gate electrode GE2 is connected to the first capacitor plate CS1. The second source electrode SE2 is connected to the driving voltage line DVL. The second drain electrode DE2 is connected to a first electrode 171 through a third contact hole CH3.

An organic light emitting layer 172 is on the first electrode 171, and a second electrode 173 is on the organic light emitting layer 172. A common voltage is applied to the second electrode 173. The organic light emitting layer 172 generates light according to an output signal of the driving thin film transistor TFT2.

The capacitor may be connected, for example, between the second gate electrode GE2 and the second source electrode SE2 of the driving thin film transistor TFT2. The capacitor Cst may be connected in a different manner in another embodiment. The capacitor Cst charges and maintains a signal input to the second gate electrode GE2 of the driving thin film transistor TFT2. The capacitor Cst includes the first capacitor plate CS1 connected to the first drain electrode DE1 through the sixth contact hole CH6 and a second capacitor plate CS2 connected to the driving voltage line DVL.

Referring to FIG. 3, the thin film transistors TFT1 and TFT2 and the OLED 170 are on a substrate 111. The substrate 111 may include, for example, include an insulating material such as glass, plastic, quartz, or the like. The material for the substrate 111 may be selected, for example, from materials which are excellent in mechanical strength, thermal stability, transparency, surface smoothness, ease of handling and water resistance.

A buffer layer may be on the substrate 111 to substantially prevent diffusion of impurities into the switching thin film transistor TFT1 and the driving thin film transistor TFT2.

The first semiconductor layer SM1 and the second semiconductor layer SM2 are on the substrate 111. The first semiconductor layer SM1 and the second semiconductor layer SM2 include a semiconductor material and serve as active layers of the switching thin film transistor TFT1 and the driving thin film transistor TFT2, respectively. Each of the first semiconductor layer SM1 and the second semiconductor layer SM2 includes a channel area CA between a source area SA and a drain area DA.

The first semiconductor layer SM1 and the second semiconductor layer SM2 may include, for example, amorphous silicon, or polycrystalline silicon may include an oxide semiconductor. For example, each of the first semiconductor layer SM1 and the second semiconductor layer SM2 may include an inorganic semiconductor material or an organic semiconductor material. The source area SA and the drain area DA may be doped with an n-type impurity or a p-type impurity.

A gate insulating layer 121 is on and may protect the first semiconductor layer SM1 and the second semiconductor layer SM2. The gate insulating layer 121 may include an organic insulating material or an inorganic insulating material.

The first gate electrode GE1 and the second gate electrode GE2 are on the gate insulating layer 121. The first gate electrode GE1 and the second gate electrode GE2 may overlap the channel areas CA of the first semiconductor layer SM1 and the second semiconductor layer SM2, respectively. The first capacitor plate CS1 is on the gate insulating layer 121. In one embodiment, the second gate electrode GE2 and the first capacitor plate CS1 may have a unitary construction.

An insulating interlayer 122 is on the first gate electrode GE1, the second gate electrode GE2, and the first capacitor plate CS1. The insulating interlayer 122 may include an organic insulating material or an inorganic insulating material.

The first source electrode SE1, the first drain electrode DE1, the second source electrode SE2, and the second drain electrode DE2 are on the insulating interlayer 122. The second drain electrode DE2 contacts the drain area DA of the second semiconductor layer SM2 through a first contact hole CH1 defined at the gate insulating layer 121 and the insulating interlayer 122. The second source electrode SE2 contacts the source area SA of the second semiconductor layer SM2 through a second contact hole CH2 defined at the gate insulating layer 121 and the insulating interlayer 122. The first source electrode SE1 contacts the first semiconductor layer SM1 through a fourth contact hole CH4 defined at the gate insulating layer 121 and the insulating interlayer 122. The first drain electrode DE1 contacts the first semiconductor layer SM1 through the fifth contact hole CH5 defined at the gate insulating layer 121 and the insulating interlayer 122.

The data line DL, the driving voltage line DVL, and the second capacitor plate CS2 are on the insulating interlayer 122. The second capacitor plate CS2 and the driving voltage line DVL may have a unitary construction.

A passivation layer 130 is on the first source electrode SE1, the first drain electrode DE1, the second source electrode SE2, and the second drain electrode DE2. The passivation layer 130 serves to protect the switching thin film transistor TFT1 and the driving thin film transistor TFT2 and also serves to planarize upper surfaces thereof.

According to an exemplary embodiment, the passivation layer 130 includes a polymer resin. For example, the passivation layer 130 may include polyimide (PI). Referring to FIGS. 1 and 3, the passivation layer 130 includes recessed portions 211, 212, 213, and 214, and a trench 711.

The first electrode 171 is on the passivation layer 130 and may be, for example, an anode. According to an exemplary embodiment, the first electrode 171 is a pixel electrode. The first electrode 171 is connected to the second drain electrode DE2 of the driving thin film transistor TFT2 through the third contact hole CH3 at the passivation layer 130.

A pixel defining layer 190 partitions a light emission area and is on the passivation layer 130. The pixel defining layer 190 may include, for example, a polymer organic material. The pixel defining layer 190 may include, for example, at least one of a polyimide (PI) resin, a polyacrylic resin, a PET resin, and a PEN resin. According to an exemplary embodiment, the pixel defining layer 190 includes a polyimide (PI) resin.

The pixel defining layer 190 defines an opening 195. The first electrode 171 is exposed from the pixel defining layer 190 through the opening 195. A light emission area of OLED 170 is defined by the opening 195 and may be referred to as a pixel area.

Referring to FIGS. 1 and 3, the pixel defining layer 190 exposes an upper surface of the first electrode 171 and protrudes from the first electrode 171 along the periphery of each of the pixels PX. The first electrode 171 overlaps at least a portion of the pixel defining layer 190 and does not overlap the pixel defining layer 190 at the opening 195. The opening 195 may be defined as an area above the first electrode 171 that does not overlap the pixel defining layer 190. A boundary at which the pixel defining layer 190 contacts the first electrode 171 at the opening 195 may be referred to as an edge 191 of the opening 195.

The first electrode 171 has conductivity and may be a transmissive electrode, a transflective electrode, or a reflective electrode. When the first electrode 171 is a transmissive electrode, the first electrode 171 includes a transparent conductive oxide. The transparent conductive oxide may include, for example, at least one of indium tin oxide (ITO), indium zinc oxide (IZO), zinc oxide (ZnO), and indium tin zinc oxide (ITZO). When the first electrode 171 is a transflective electrode or a reflective electrode, the first electrode 171 may include, for example, at least one of Ag, Mg, Al, Pt, Pd, Au, Ni, Nd, Ir, Cr, and Cu.

The organic light emitting layer 172 is on the first electrode 171. For example, the organic light emitting layer 172 is disposed on the first electrode 171 at the opening 195. The organic light emitting layer 172 may be on a sidewall of the opening 195 defined by the pixel defining layer 190 and on the pixel defining layer 190.

The organic light emitting layer 172 includes a light emitting material. In addition, the organic light emitting layer 172 may include a host and a light emitting dopant. The organic light emitting layer 172 may be formed, for example, using various methods such as a vacuum deposition method, a spin coating method, a cast method, a langmuir-blodgett (LB) method, an inkjet printing method, a laser printing method, a laser induced thermal imaging (LITI) method, and the like. At least one of a hole injection layer (HIL) and a hole transport layer (HTL) may be between the first electrode 171 and the organic light emitting layer 172.

The second electrode 173 is on the organic light emitting layer 172 and may be a common electrode or a cathode. The second electrode 173 may be a transmissive electrode, a transflective electrode, or a reflective electrode. When the second electrode 173 is a transmissive electrode, the second electrode 173 may include, for example, at least one of Li, Ca, LiF/Ca, LiF/Al, Al, Mg, BaF, Ba, Ag and Cu. In one embodiment, the second electrode 173 may include a mixture of Ag and Mg.

When the second electrode 173 is a transflective electrode or a reflective electrode, the second electrode 173 may include, for example, at least one of Ag, Mg, Al, Pt, Pd, Au, Ni, Nd, Ir, Cr, Li, Ca, LiF/Ca, LiF/Al, Mo, Ti and Cu. In addition, the second electrode 173 may include, for example, a transparent conductive layer including indium tin oxide (ITO), indium zinc oxide (IZO), zinc oxide (ZnO), indium-zinc-tin oxide (IZTO), and the like, in addition to the transflective electrode or the reflective electrode.

At least one of an electron transport layer (ETL) and an electron injection layer (EIL) may be between the organic light emitting layer 172 and the second electrode 173.

When the OLED 170 is a top emission-type, the first electrode 171 may be a reflective electrode and the second electrode 173 may be a transmissive electrode or a transflective electrode. When the OLED 170 is a bottom emission-type, the first electrode 171 may be a transmissive electrode or a transflective electrode and the second electrode 173 may be a reflective electrode. According to an exemplary embodiment, the OLED 170 is a top emission-type, the first electrode 171 is a reflective electrode, and the second electrode 173 is a transflective electrode.

According to an exemplary embodiment, the passivation layer 130 includes the trench 711 formed outside the first electrode 171 and the recessed portions 211, 212, 213, and 214 located below the first electrode 171 and overlapping the opening 195. The trench 711 is spaced apart from the first electrode 171 on a plane. Referring to FIG. 3, the trench 711 may have a concave cross-section, but may have a different cross-section in another embodiment.

When a polymer resin has fluidity in a thermosetting process of the polymer resin for forming the passivation layer 130, the trench 711 serves to substantially prevent the polymer resin from flowing to the recessed portions 211, 212, 213, and 214 and impairing pattern stability of the recessed portions 211, 212, 213, and 214. For example, thermosetting of the polymer resin for forming the passivation layer 130 proceeds and the polymer resin has fluidity in the thermosetting process. When the polymer resin having such fluidity flows to the recessed portions 211, 212, 213, and 214, the recessed portions 211, 212, 213, and 214 may be buried. Also, the depths of the recessed portions 211, 212, 213, and 214 may decrease or the recessed portions 211, 212, 213, and 214 may disappear. When the recessed portions 211, 212, 213, and 214 are buried in such a manner, the effect of substantially preventing color shift and WAD by virtue of the recessed portions 211, 212, 213, and 214 may not be achieved.

In order to substantially prevent this, according to an exemplary embodiment, the trench 711 is formed around the first electrode 171. When the trench 711 is formed around the first electrode 171, the polymer resin which has obtained fluidity may flow to the trench 711 in the thermosetting process. Thus, the polymer resin may be substantially prevented from flowing to the recessed portions 211, 212, 213, and 214. Accordingly, pattern stability of the recessed portions 211, 212, 213, and 214 may be ensured. Also, the effect of substantially preventing the color shift and the WAD may be achieved by virtue of the recessed portions 211, 212, 213, and 214.

According to an exemplary embodiment, the trench 711 may fully enclose the first electrode 171 on a plane. In one embodiment, the trench 711 may partially enclose the first electrode 171 (e.g., see FIGS. 4A, 4B, 5A, 5B, 17, and 19). In addition, the trenches 711 may also include a plurality of recessed patterns partially enclosing the first electrode 171 (e.g., see FIGS. 4A, 4B, 5A, 5B, 17 and 19).

According to an exemplary embodiment, the trench 711 has a predetermined width b1 and a predetermined depth d3 and is spaced from the first electrode 171.

A space s1 between the first electrode 171 and the trench 711 may depend on the size of the OLED 170, the size of the first electrode 171, the distance between adjacent first electrodes 171, and/or other factors. According to an exemplary embodiment, the trench 711 may be spaced apart from the first electrode 171 by a distance in a range from about 1 μm to about 5 μm. For example, the trench 711 may be spaced apart from the first electrode 171 by a distance in a range from about 1.5 μm to about 2.5 μm.

The trench 711 may have a width b1 in a range from about 1.0 μm to about 3.0 μm. The width b1 of the trench 711 may vary, for example, depending on the distance between adjacent first electrodes 171.

The trench 711 may have a depth d3 in a range from about 0.2 μm to about 1.0 μm. For example, the trench 711 may have a depth d3 in a range from about 0.3 μm to about 0.7 μm. The depth d3 of the trench 711 may vary, for example, depending on the thickness of the passivation layer 130. When the passivation layer 130 has a thickness of about 1 μm or more, the trench 711 may have a thickness of about 1 μm or more. When the passivation layer 130 has a thickness of about 0.3 μm or less, the trench 711 may have a thickness of about 0.3 μm or less.

The passivation layer 130 includes recessed portions 211, 212, 213, and 214 at areas overlapping the opening 195 defined by the pixel defining layer 190. Since the first electrode 171 is also above the recessed portions 211, 212, 213, and 214, the first electrode 171 includes a recessed portion.

The recessed portions 211, 212, 213, and 214 are spaced apart from the edge 191 of the opening 195 on a plane. For example, an edge BR of the recessed portions 211, 212, 213, and 214 is spaced apart from the edge 191 of the opening 195 on a plane.

The edge 191 of the opening 195 may refer to a boundary of the opening 195, and may be defined, for example, as a boundary at which the pixel defining layer 190 contacts the first electrode 171. In one embodiment, the edge 191 of the opening 195 may be defined as a boundary at which the passivation layer 130 and the pixel defining layer 190 overlap each other on a plane.

Referring to FIGS. 1 and 3, recessed portions 211, 212, 213, and 214 are absent below the edge 191 of the opening 195. For example, the recessed portions 211, 212, 213, and 214 do not overlap the edge 191 of the opening 195.

Accordingly, the passivation layer 130 has a substantially same height h1 with respect to a surface of the substrate 111 at a boundary where the passivation layer 130 overlaps the pixel defining layer 190. For example, the passivation layer 130 has substantially the same height h1 along the edge 191 of the opening 195. In one embodiment, the passivation layer 130 may have a height difference of about 0.1 μm or less with respect to the surface of the substrate 111 at the boundary where the passivation layer 130 overlaps the pixel defining layer 190.

In addition, according to an exemplary embodiment, the edge 191 of the opening 195 has a substantially same height with respect to the surface of the substrate 111. For example, the edge 191 of the opening 195 may have a height difference of about 0.1 μm or less with respect to the surface of the substrate 111.

The pixel defining layer 190 may be formed through a patterning process such as a photolithography method. In such an exemplary embodiment, the edge 191 of the opening 195 corresponds to a boundary of a pattern. However, if a lower surface of the pattern boundary is non-uniform (e.g., not flat), it may be difficult to form a uniform pattern. According to an exemplary embodiment, the edge 191 of the opening 195 has a uniform height that is flat. As a result, the occurrence of pattern defects in the process of forming the pixel defining layer 190 may be substantially prevented.

The recessed portions 211, 212, 213, and 214 are spaced apart from the edge 191 of the opening 195, so that the edge 191 of the opening 195 is flat.

According to an exemplary embodiment, the recessed portions 211, 212, 213, and 214 may be spaced apart from the edge 191 of the opening 195 on a plane by a distance, for example, in a range from about 0.5 μm to about 5.0 μm. In such an exemplary embodiment, a distance V1 between the recessed portions 211, 212, 213, and 214 and the edge 191 of the opening 195 is determined by a distance between the edge 191 of the opening 195 and the edge BR of the recessed portions 211, 212, 213, and 214.

The distance V1 between the recessed portions 211, 212, 213, and 214 and the edge 191 of the opening 195 may vary, for example, depending on the size of the OLED 170. For example, the recessed portions 211, 212, 213, and 214 may be spaced apart from the edge 191 of the opening 195 on a plane by a distance, for example, in a range from about 0.5 μm to about 2.0 μm or, for example, may be spaced apart from the edge 191 of the opening 195 on a plane by a distance of about 5.0 μm or more.

At least a part of the edge BR of the recessed portions 211, 212, 213, and 214 may be parallel to the edge 191 of the opening 195. Referring to FIG. 1, at least one side of the edge BR of the recessed portions 211, 212, 213, and 214 is parallel to the edge 191 of the opening 195. When the edge BR of the recessed portions 211, 212, 213 and 214 and the edge 191 of the opening 195 are parallel to each other, the distance V1 between the recessed portions 211, 212, 213, and 214 and the edge 191 of the opening 195 may be easily maintained. Accordingly, the pattern may be formed uniformly in the process of forming the pixel defining layer 190.

The width W1 of the recessed portions 211, 212, 213, and 214 may vary, for example, depending on the size of the OLED 170, the size of the first electrode 171, the number of the recessed portions, and/or other factors. According to an exemplary embodiment, the recessed portions 211, 212, 213, and 214 may have a width W1, for example, in a range from about 1.0 μm to about 2.0 μM.

The depth d1 of the recessed portions 211, 212, 213, and 214 may vary, for example, depending on the thickness of the passivation layer 130. According to an exemplary embodiment, the recessed portions 211, 212, 213, and 214 may have a depth d1, for example, in a range from about 0.2 μm to about 1.0 μm. In one embodiment, the recessed portions 211, 212, 213, and 214 may have a depth d1 in a range from about 0.3 μm to about 0.7 μm. When the passivation layer 130 has a thickness of about 1 μm or more, the recessed portions 211, 212, 213 and 214 may have a thickness of about 1 μm or more. When the passivation layer 130 has a thickness of about 0.3 μm or less, the recessed portions 211, 212, 213, and 214 may have a thickness, for example, of about 0.3 μm or less.

When the recessed portions 211, 212, 213, and 214 have such a width W1 and a depth d1, light generated in the organic light emitting layer 172 may resonate in a lateral direction. Accordingly, color shift and WAD depending on viewing angle may be substantially prevented or suppressed.

Adjacent ones of the recessed portions 211, 212, 213, and 214 may be arranged at a pitch, for example, in a range from about 1 μm to about 6 μm. The pitch between the recessed portions 211, 212, 213, and 214 may vary, for example, depending on the planar area of the first electrode 171 and the size of the OLED 170.

The first electrode 171 contacts the driving thin film transistor TFT2 through the third contact hole CH3 defined at the passivation layer 130. Referring to FIGS. 1 and 3, the recessed portions 211, 212, 213, and 214 have a depth less than a depth d2 of the third contact hole CH3. In one embodiment, the recessed portions 211, 212, 213, and 214 may have a depth substantially equal to a depth of the third contact hole CH3 or may have a depth greater than the depth of the third contact hole CH3.

Referring to FIG. 3, the passivation layer 130 may include two or more recessed portions 211, 212, 213, and 214 overlapping one opening 195. The first electrode 171 is above and overlaps the recessed portions 211, 212, 213, and 214. Accordingly, the first electrode 171 may include a recessed portion corresponding to the recessed portions 211, 212, 213, and 214.

Figure 4A:
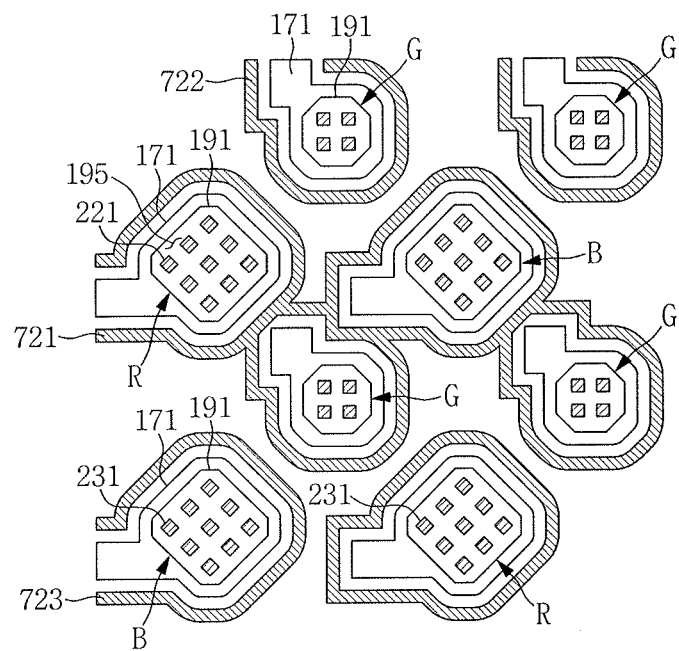
FIGS. 4A and 4B illustrate embodiments of a first electrode, a recessed portion and a trench of a pixel.
Figure 4B:
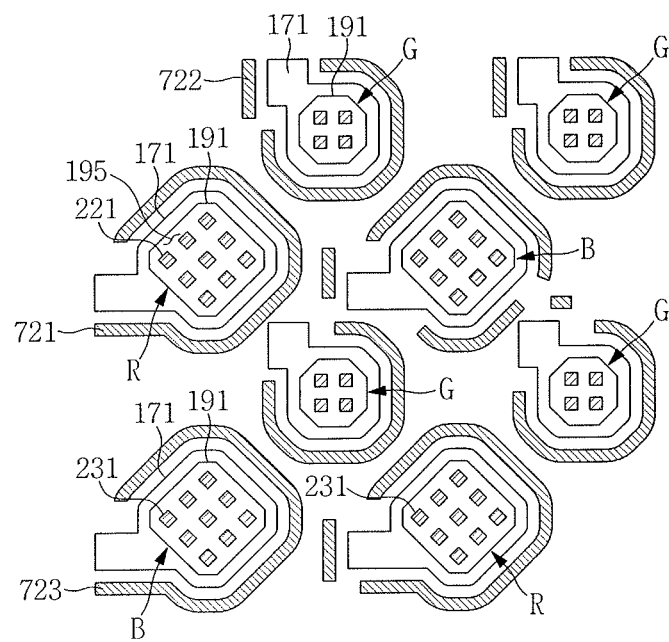

FIGS. 4A and 4B respectively illustrate, in plan view, arrangements of a first electrode 171, a recessed portion 221, and trenches 721, 722 and 723 of a pixel according to exemplary embodiments. In FIGS. 4A and 4B, R corresponds to a red pixel, G corresponds to a green pixel, and B corresponds to a blue pixel. An edge 191 of an opening 195 shown in FIGS. 4A and 4B is an area of the first electrode 171.

The first electrode 171 illustrated in FIGS. 4A and 4B has an octagonal planar shape. However, the first electrode 171 may have a different shape in another embodiment. A passivation layer 130 includes a plurality of dot-shaped recessed portions 221, each of which has a circular planar shape. The recessed portions 221 are located inside the edge 191 of the opening 195 and may be arranged symmetrically or asymmetrically with respect to a center of the opening 195.

Referring to FIG. 4A, a first trench 721 fully encloses first electrodes 171 of a green pixel G and a blue pixel B and partially encloses a first electrode 171 of a red pixel R. The first trench 721 encloses the first electrodes 171. A second trench 722 encloses a first electrode 171 of a green pixel G and a third trench 723 encloses a first electrode 171 of a blue pixel B. For example, one of the second and third trenches 722 and 723 enclosing one of the first electrodes 171 may not be connected to another of the second and third trenches 722 and 723 enclosing another of the first electrodes 171.

Referring to FIG. 4B, the trenches 271, 272 and 273 are divided. Referring to FIG. 4A, there are areas at which two lines of the trench form an acute angle. Referring to FIG. 4B, no trench is formed at an area corresponding to the acute angle forming area shown in FIG. 4A.

According to an exemplary embodiment, the passivation layer 130 including the recessed portion 221 and the trenches 721, 722, and 723 may be formed by exposure and development of a photosensitive material. When two trenches meet to form an acute angle, a deep trench may be formed due to an increase in an exposure amount during the trench formation process and a structure below the passivation layer 130 may be exposed. In order to substantially prevent this, referring to FIG. 4B, no trench is formed at an area where two trenches meet to form an acute angle.

Figure 5A:
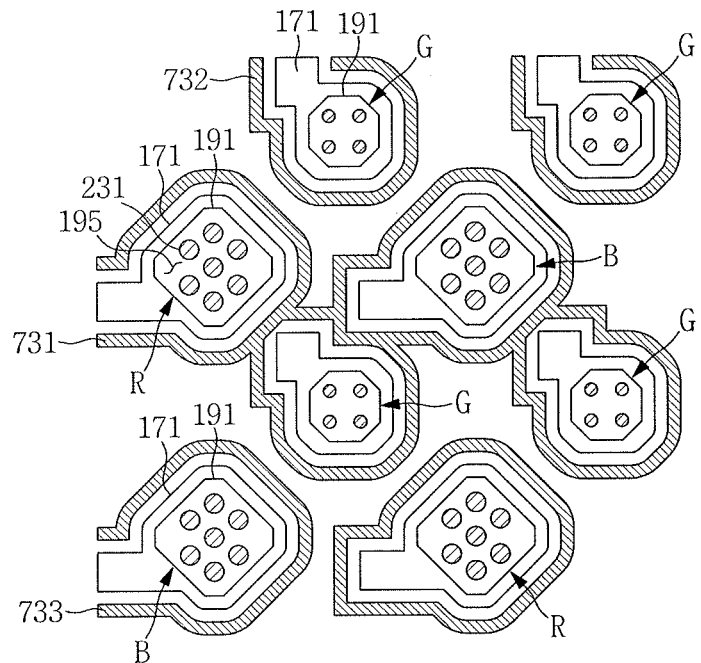
FIGS. 5A and 5B illustrate additional embodiments of a first electrode, a recessed portion, and a trench of a pixel.
Figure 5B:
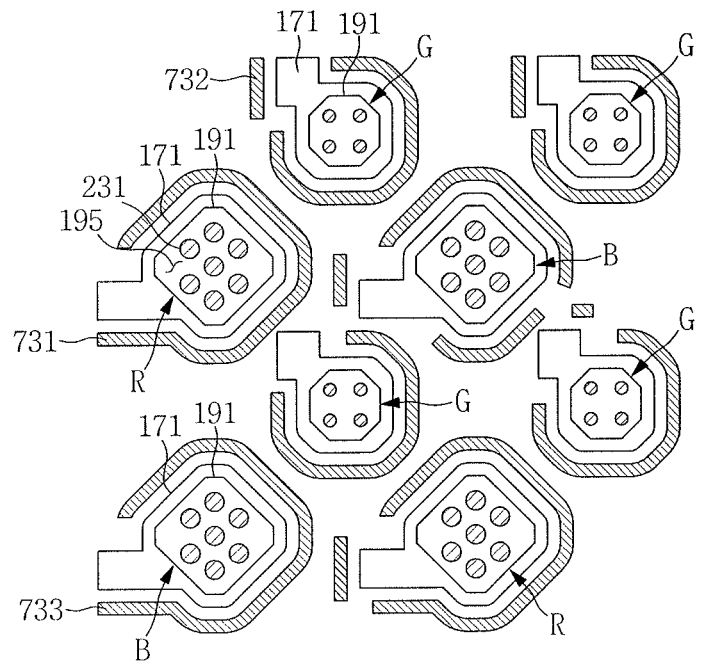

FIGS. 5A and 5B respectively illustrate arrangements of first electrode 171, recessed portion 231, and trenches 731, 732 and 733 of a pixel according to other exemplary embodiments.

Referring to FIGS. 5A and 5B, the recessed portions 231 have a circular planar shape. However, the recessed portion 231 may have a different shape (e.g., polygonal, elliptical, linear planar shape, etc.) in another embodiment. Referring to FIG. 5A, a first trench 731 encloses a plurality of first electrodes 171. Each of a second trench 732 and a third trench 733 encloses one first electrode 171. Referring to FIG. 5A, there are areas at which two lines of the trench form an acute angle. Referring to FIG. 5B, no trench is formed at an area corresponding to the acute angle forming area shown in FIG. 5A.

Figure 6A:
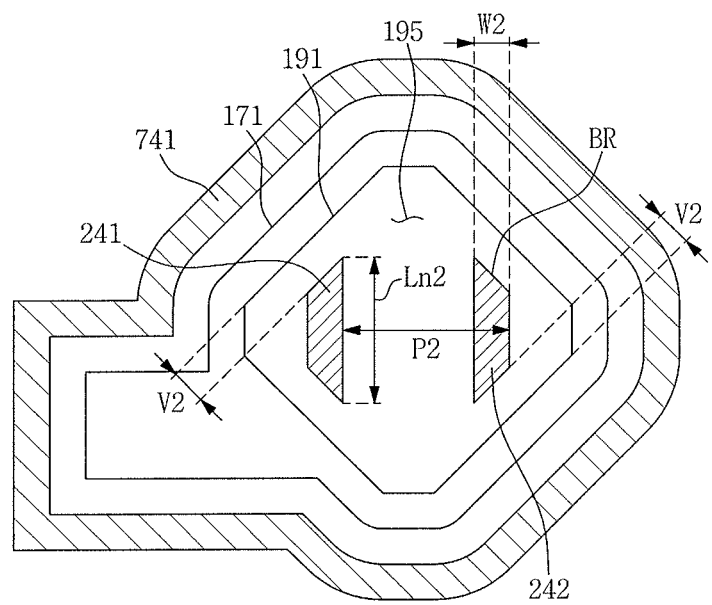
FIGS. 6A and 6B illustrate additional embodiments of a first electrode, a recessed portion, and a trench of a pixel.
Figure 6B:
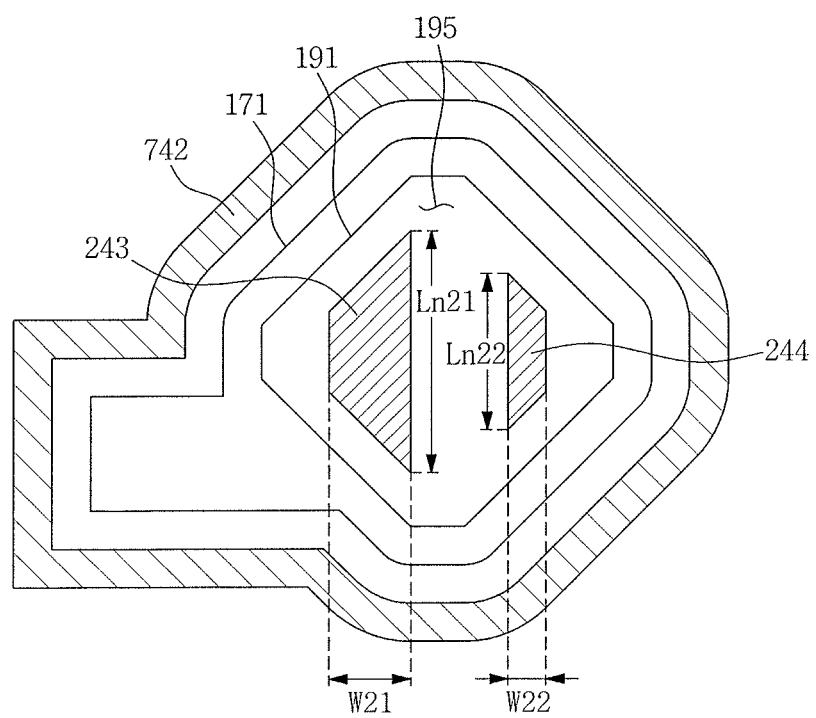

FIGS. 6A and 6B respectively illustrate arrangements of first electrode 171, recessed portions 241, 242, 243, and 244, and trenches 741 and 742 of a pixel according to other exemplary embodiments.

Referring to FIG. 6A, one first electrode 171 is above two linear-shaped recessed portions 241 and 242. For example, a passivation layer 130 includes two recessed portions 241 and 242 defined at one opening 195. Referring to FIG. 6A, the two recessed portions 241 and 242 have a linear shape extending in a vertical direction with respect to the drawings. For example, the two recessed portions 241 and 242 extend parallel to each other in a substantially same direction and may have a symmetrical shape or a substantially equal shape.

Each of the recessed portions 241 and 242 is spaced from an edge 191 of the opening 195 at a predetermined distance V2. In addition, each of the recessed portions 241 and 242 has a width W2 and a length Ln2 and the two recessed portions 241 and 242 are arranged at a predetermined pitch P2. Referring to FIG. 6A, the trench 741 fully encloses the first electrode 171 and has a predetermined width and is spaced apart from the first electrode 171 at a predetermined distance.

Referring to FIG. 6B, a plurality of asymmetric recessed portions 243 and 244 are below one first electrode 171. For example, the passivation layer 130 includes a first recessed portion 243 and a second recessed portion 244 overlapping one opening 195. A planar area of the first recessed portion 243 is greater than a planar area of the second recessed portion 244. In such an exemplary embodiment, the first recessed portion 243 may not overlap a wiring below the passivation layer 130, and the second recessed portion 244 may overlap a wiring below the passivation layer 130. In order to substantially prevent the first electrode 171 from contacting the wiring below the first electrode 171 at the second recessed portion 244, a planar area of the second recessed portion 244 is made small (e.g., predetermined relatively smaller size), so that the depth of the second recessed portion 244 is less than a depth of the first recessed portion 243.

For example, the length Ln21 of the first recessed portion 243 is greater than the length Ln22 of the second recessed portion 244, and the width W21 of the first recessed portion 243 is greater than the width W22 of the second recessed portion 244. In addition, the trench 742 fully encloses the first electrode 171, has a predetermined width, and is spaced apart from the first electrode 171 by a predetermined distance.

Figure 7:
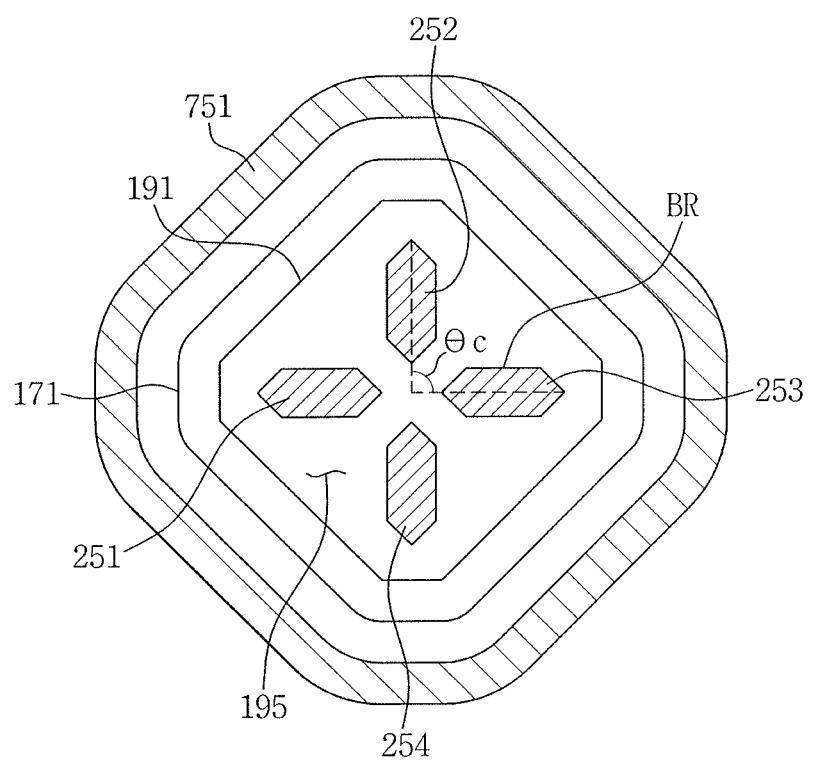
FIG. 7 illustrates another embodiment of a first electrode, a recessed portion, and a trench of a pixel.

FIG. 7 illustrates an arrangement of first electrode 171, recessed portions 251, 252, 253, and 254, and a trench 751 according to another exemplary embodiment.

Referring to FIG. 7, a passivation layer 130 includes a plurality of linear-shaped recessed portions 251, 252, 253, and 254 overlapping one opening 195. The linear-shaped recessed portions 251, 252, 253 and 254 are arranged radially.

For example, four linear-shaped recessed portions 251, 252, 253, and 254 overlapping one opening 195 are defined at the passivation layer 130. In such an exemplary embodiment, an angle θc between extending directions of the recessed portions 251, 252, 253, and 254 is in a range from about 60 degrees to about 120 degrees. For example, the four recessed portions 251, 252, 253, and 254 may be arranged such that the angle θc between the extending directions becomes about 90 degrees. As such, the recessed portions 251, 252, 253, and 254 may be symmetrically arranged with respect to a center of the opening 195.

In an exemplary embodiment, when the recessed portions 241 and 242 are arranged to extend in one direction as illustrated in FIG. 6A, color shift and WAD in a direction perpendicular to the extending direction of the recessed portions 241 and 242 may be improved. The degree of improvement in color shift and WAD in a direction substantially equal to the extending direction of the recessed portions 241 and 242 may be insignificant. For example, when the recessed portions 241 and 242 are arranged as illustrated in FIG. 6A, WAD and color shift in the horizontal direction with respect to the drawings may be improved, while the improvement in WAD and color shift in the vertical direction with respect to the drawings may be insignificant.

On the other hand, when the recessed portions 251, 252, 253, and 254 are arranged radially as illustrated in FIG. 7, color shift and WAD may be improved in both the horizontal direction and the vertical direction with respect to the drawings. Referring to FIG. 7, the trench 751 fully encloses the first electrode 171.

Figure 8A:
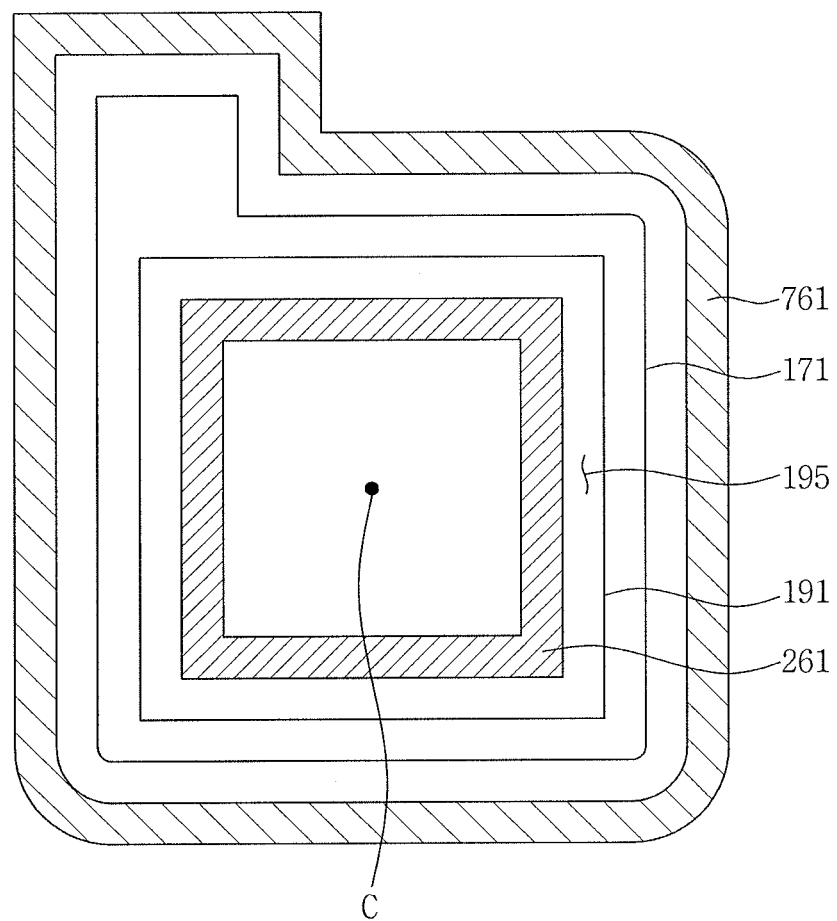
FIGS. 8A and 8B illustrate additional embodiments of a first electrode, a recessed portion, and a trench of a pixel.
Figure 8B:
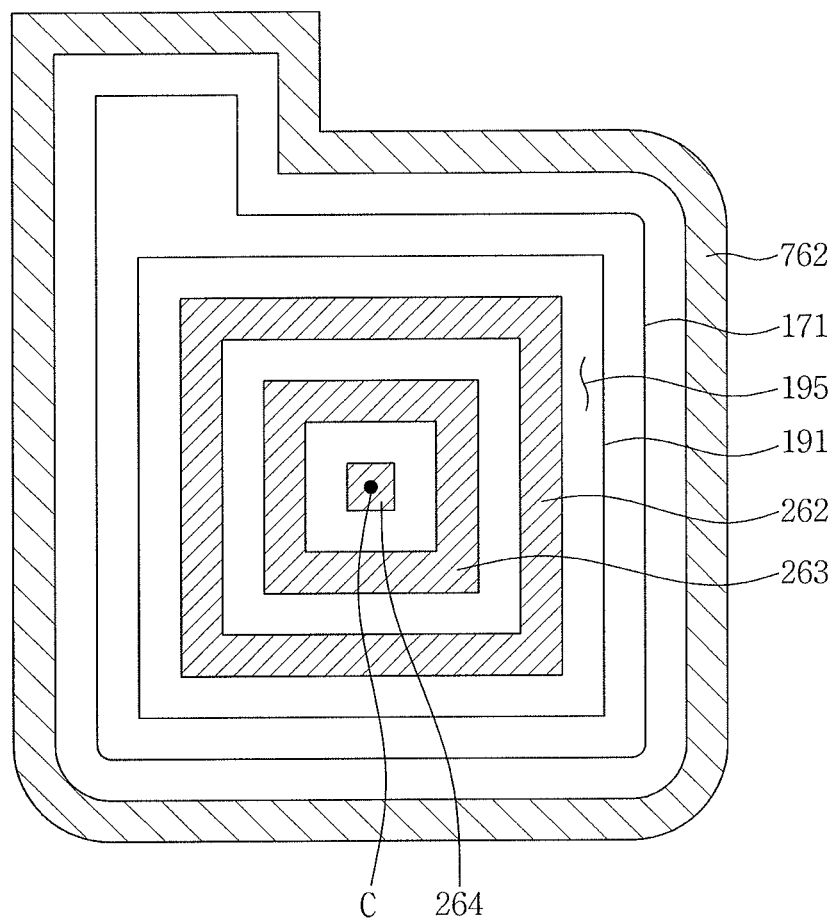

FIGS. 8A and 8B respectively illustrate arrangements of first electrode 171, recessed portions 261, 262, 263, and 264, and trenches 761 and 762 according to other exemplary embodiments.

Referring to FIG. 8A, a passivation layer 130 includes a recessed portion 261 in the form of a closed loop enclosing a center C of an opening 195. A trench 761 fully encloses the first electrode 171, and the recessed portion 261 is located inside an edge 191 of the opening 195.

Referring to FIG. 8B, the passivation layer 130 includes recessed portions 262 and 263 in the form of a plurality of closed loops enclosing the center C of the opening 195 and a dot-shaped recessed portion 264 at the center C. The trench 762 fully encloses the first electrode 171, and the recessed portions 262, 263, and 264 are located inside the edge 191 of the opening 195.

When the recessed portions 261, 262, 263, and 264 are arranged in a vertically and horizontally symmetrical shape with respect to the center C as illustrated in FIGS. 8A and 8B, color shift and WAD may be improved in all directions.

Figure 9A:
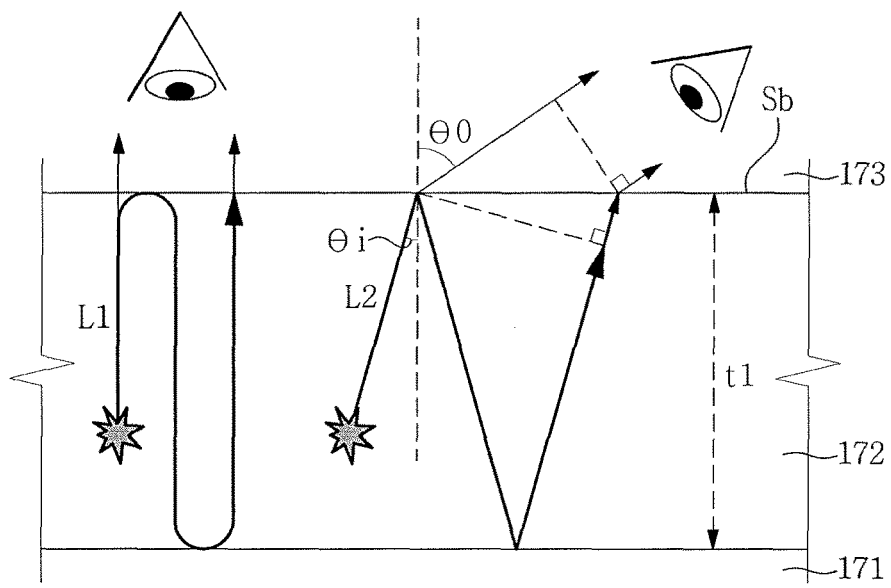
FIG. 9A illustrates an example of white angular dependency (WAD)
Figure 9B:
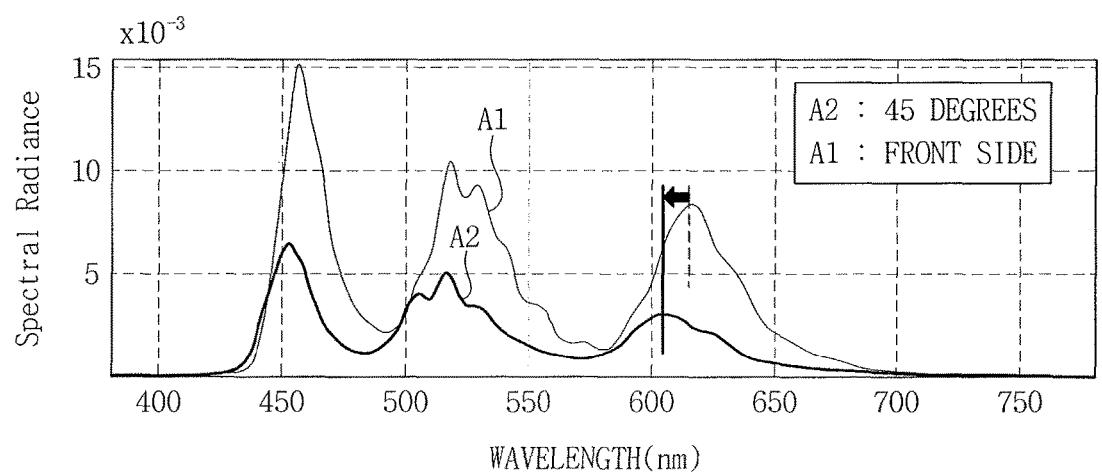
FIG. 9B illustrates an example of wavelength shift according to viewing angle.

FIG. 9A illustrates a cross-sectional view of an example of WAD, and FIG. 9B illustrates an example of wavelength shift according to a viewing angle.

Referring to FIG. 9A, the OLED display device 101 has a multi-layer stack structure (e.g., see FIG. 3). Light is emitted from the organic light emitting layer 172 in an outward direction and passes through the multi-layer structure. According to an exemplary embodiment, the light generated in the organic light emitting layer 172 passes through the second electrode 173 and is emitted outwardly.

When optical resonance occurs in the course of the light repeatedly reflecting between two reflective surfaces, energy of the light increases, The light having the increased energy may relatively easily pass through the multi-layer stacked structure to be emitted outwards. Such a structure that allows light to resonate between two reflective layers may be referred to as a resonance structure. The distance between the two reflective layers at which resonance occurs may be referred to as a resonance distance. The resonance distance depends on the wavelength of light.

According to an exemplary embodiment, in the OLED display device 101 the first electrode 171 is a reflective electrode and the second electrode 173 is a transflective electrode. Accordingly, light may be reflected between the first electrode 171 and the second electrode 173 and light resonance may occur. When the wavelength of the light emitted from the organic light emitting layer 172 is denoted λ1 and the distance between the first electrode 171 and the second electrode 173 is denoted t1, light resonance may occur when Formula 1 is satisfied.

$$2 \cdot n1 \cdot t1 = m1 \cdot \lambda 1 \quad (1)$$

In Formula 1, n1 denotes an average refractive index between the first electrode 171 and the second electrode 173, and m1 is a natural number. The distance t1 between the first electrode 171 and the second electrode 173 is a distance between an upper surface of the first electrode 171 and a lower surface of the second electrode 173 opposing each other.

In an exemplary embodiment, light of a same color may be visually recognized as different colors depending on the viewing angle of an observer. For example, when a display surface of a display device that emits white light is viewed from the front side, white color may be recognized. However, when this light is viewed from the lateral side, a bluish or yellowish color may be recognized. This phenomenon is called WAD, which may be caused due to a path difference of light depending on the viewing angle.

Referring to FIG. 9A, light L1 viewed from the front side may resonate according to Formula 1. Light L2 emitted toward the lateral side is incident to an interface Sb at an angle θi in a medium having a thickness t1 and a refractive index n1 and is emitted at an angle θo. In such an exemplary embodiment, when the wavelength of the light L2 emitted toward the lateral side is denoted λ, the relationship of Formula 2 may be satisfied in order for lights having different light paths to resonate.

$$2 \cdot nc \cdot t1 \cdot \cos(\theta i) = m \cdot \lambda \quad (2)$$

where m is an integer.

When the incident angle θi at the interface Sb increases, the value of cos(θi) decreases. Accordingly, the resonance condition and the resonance wavelength may change. Thus, the wavelength of the light L2 emitted toward the lateral side may differ from the wavelength of the light L1 emitted toward the front side. For example, when the incident angle θi increases, the value of cos(θi) decreases. Accordingly, the wavelength λ that satisfies the resonance condition becomes less. As a result, the light L2 having a wavelength shorter than a wavelength of the light L1 emitted toward the front side is emitted toward the lateral side.

FIG. 9B illustrates an example of a spectrum of light A1 observed from the front side and a spectrum of light A2 observed from the lateral side at an angle of about 45 degrees. A peak wavelength of the light A2 observed from the lateral side at the angle of about 45 degrees is shifted toward a shorter wavelength, as compared with a peak wavelength of the light A1 observed from the front side.

Figure 10:
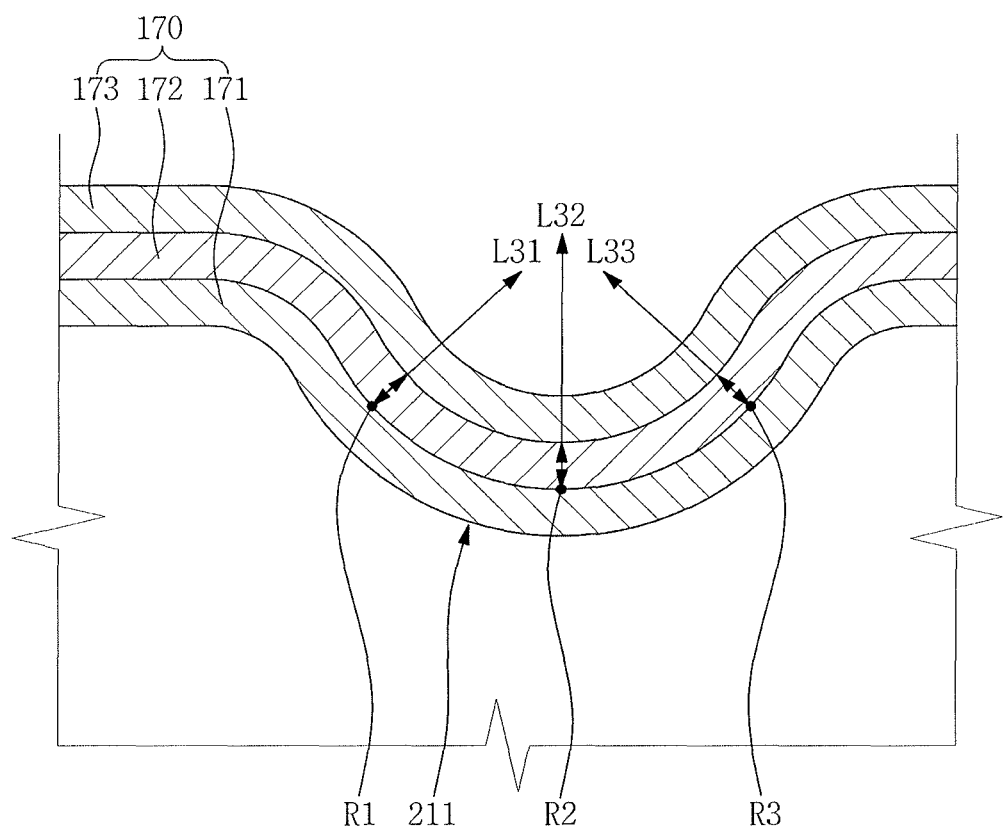
FIG. 10 illustrates an example of resonance at a recessed portion.

FIG. 10 illustrates a cross-sectional view of resonance at the recessed portion 210 according to one embodiment. As described above, according to an exemplary embodiment, the first electrode 171 of the OLED display device 101 is a reflective electrode and the second electrode 173 is a transflective electrode. Accordingly, light reflects between the first electrode 171 and the second electrode 173 and light resonance occurs. In such an exemplary embodiment, resonance also occurs between the first electrode 171 and the second electrode 173 at the recessed portion 210. At the recessed portion 210, lights L31, L32, and L33 resonate in a direction perpendicular to surfaces of the first electrode 171 and the second electrode 173 and have a substantially the same or similar wavelength, but are emitted in different directions.

For example, referring to FIG. 10, the lights L31, L32, and L33 resonating in directions perpendicular to the surfaces of the first electrode 171 and the second electrode 173 at different points R1, R2, and R3 of the recessed portion 210 are not only emitted in the front direction but also in the lateral direction. Accordingly, the lights L31 and L33 viewed from the lateral side and the light L32 viewed from the front side have substantially the same wavelength. As a result, color shift and WAD in the lateral direction may be substantially prevented.

If the recessed portion 211 of the present embodiment is not included, light totally reflected between two reflective layers may not be emitted to the outside and may be extinguished. For example, when light is totally reflected between the first electrode 171 and the second electrode 173, the light may be guided only horizontally, and thus may fail to be emitted outwardly. As a result, the light is dissipated. However, in accordance with the present embodiment, when the recessed portion 211 is defined, the path of the light that is horizontally guided is changed and the totally reflected light may be emitted outwardly. Accordingly, the luminous efficiency of the OLED display device 101 may be improved.

Figure 11:
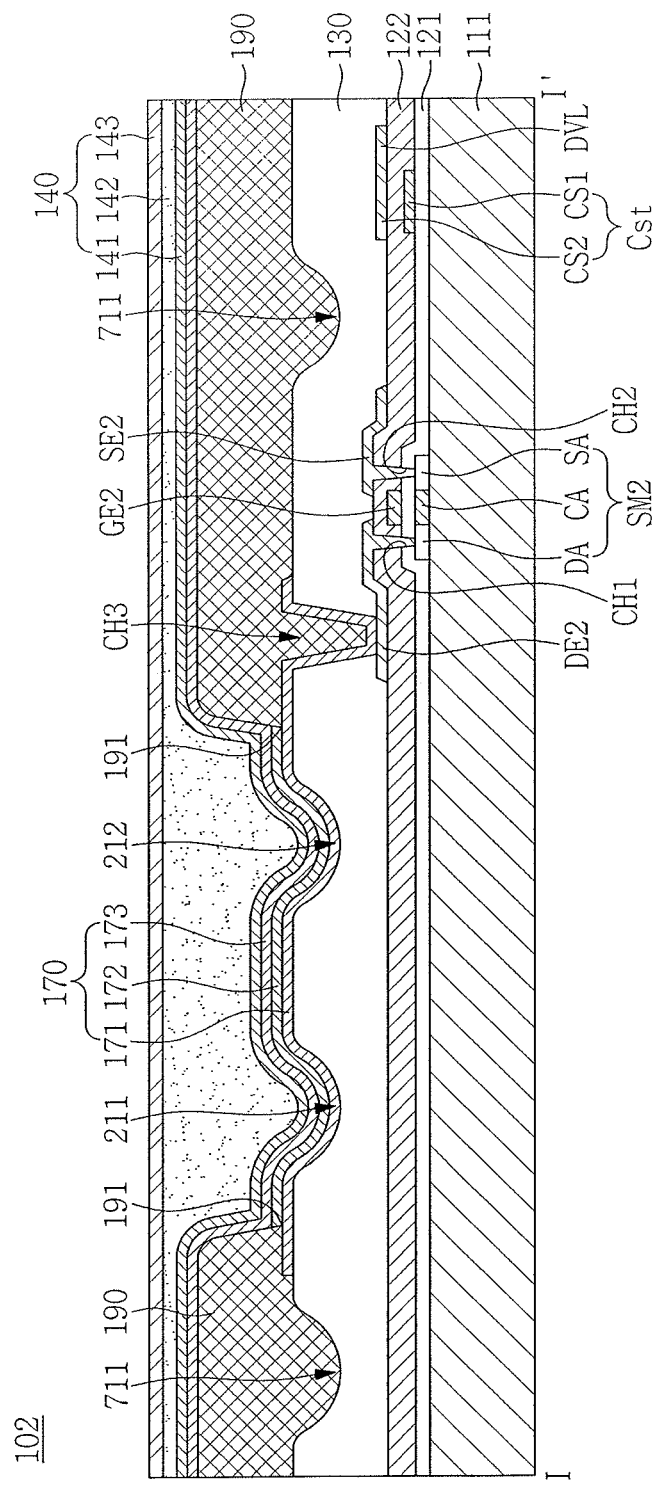
FIG. 11 illustrates an embodiment of an organic light emitting diode display device.

FIG. 11 illustrates a cross-sectional view of another embodiment of an OLED display device 102. The OLED display device 102 illustrated in FIG. 11 includes a thin film encapsulation layer 140 on a second electrode 173 to protect an OLED 170. The thin film encapsulation layer 140 substantially prevents moisture or oxygen from permeating into the OLED 170.

The thin film encapsulation layer 140 includes at least one inorganic layer 141 and 143 and at least one organic layer 142 that are alternately disposed. The thin film encapsulation layer 140 illustrated in FIG. 11 includes two inorganic layers 141 and 143 and one organic layer 142. The structure of the thin film encapsulating layer 140 may be different in another embodiment.

The inorganic layers 141 and 143 may include at least one of metal oxide, metal oxynitride, silicon oxide, silicon nitride, and silicon oxynitride. The inorganic layers 141 and 143 may be formed through a chemical vapor deposition (CVD) method, an atomic layer deposition (ALD) method, or another method.

The organic layer 142 may include, for example, a polymer material. The organic layer 142 may be formed, for example, through a thermal deposition process which may be performed within a temperature range that does not damage OLED 170. The organic layer 142 may be formed by a different method in another embodiment.

The inorganic layers 141 and 143 have a high density of thin film and thus may suppress permeation of moisture or oxygen. Most of moisture and oxygen are blocked by the inorganic layers 141 and 143 from penetrating into the OLED 170. The moisture and oxygen that does pass through the inorganic layers 141 and 143 may be blocked again by the organic layer 142. The organic layer 142 may also function as a buffer layer to reduce stress between respective ones of the inorganic layers 141 and 143. Since the organic layer 142 has planarizing characteristics, an uppermost surface of the thin film encapsulation layer 140 may be planarized by the organic layer 142.

The thin film encapsulation layer 140 may have a predetermined thin thickness, which allows the OLED display device 102 to have a significantly thin thickness. Such an OLED display device 102 may have excellent flexible characteristics.

Figure 12:
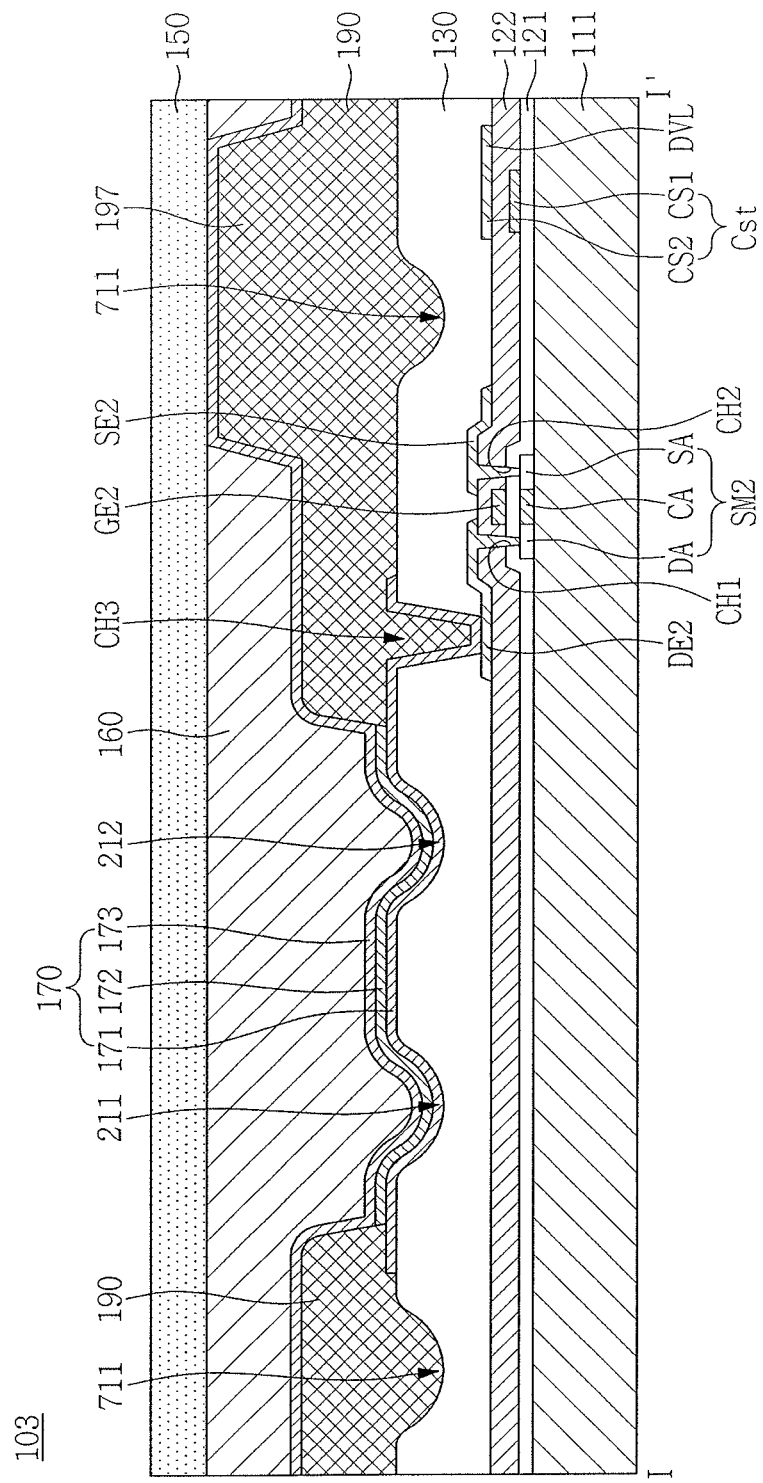
FIG. 12 illustrates another embodiment of an organic light emitting diode display device.

FIG. 12 illustrates a cross-sectional view of another embodiment of an OLED display device 103. The OLED display device 103 includes a sealing member 150 on a second electrode 173 to protect an OLED 170.

The sealing member 150 may include a light transmissive insulating material such as glass, quartz, ceramic and plastic. The sealing member 150 has a plate shape and is attached to a substrate 111 to protect the OLED 170.

A filler 160 may be between the OLED 170 and the sealing member 150. The filler 160 may include an organic material, for example, a polymer. In addition, a passivation layer may be on the OLED 170 to protect the OLED 170. The passivation layer may include, for example, a metal or an inorganic material.

Referring to FIG. 12, the OLED display device 103 includes a spacer 197 on a pixel defining layer 190. The spacer 197 serves to maintain a distance between the substrate 111 and the sealing member 150. The spacer 197 protrudes toward an upper portion of the pixel defining layer 190, that is, opposite to a passivation layer 130. Similar to the pixel defining layer 190, the spacer 197 may include a polyacrylic resin or a polyimide (PI) resin.

The spacer 197 and the pixel defining layer 190 may have a unitary construction. For example, the pixel defining layer 190 and the spacer 197 may be formed to have a unitary construction through a photolithography process using a photosensitive material. In an exemplary embodiment, the pixel defining layer 190 and the spacer 197 may be formed sequentially or separately and/or may include different materials, respectively.

The spacer 197 may have a shape of a truncated pyramid, a prism, a truncated cone, a cylinder, a hemisphere, a hemi-spheroid, or another shape.

FIGS. 13A-13J illustrate various stages of an embodiment of a method for manufacturing an OLED display device, which, for example, may be OLED display device 101.

Figure 13A:
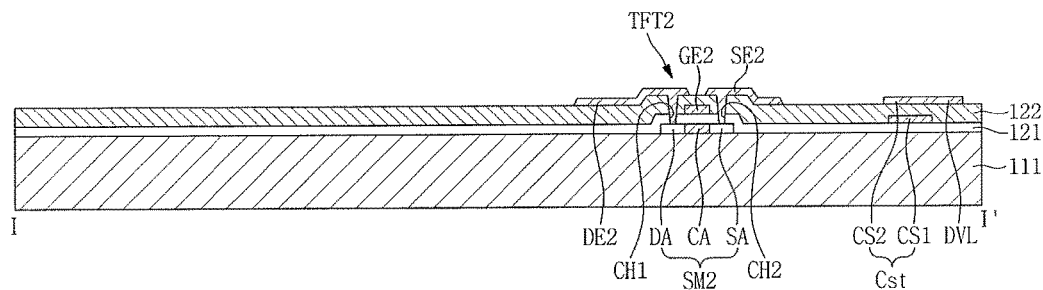
FIGS. 13A-13J illustrate stages of an embodiment of a method for manufacturing an embodiment of an organic light emitting diode display device.

Referring to FIG. 13A, a driving thin film transistor TFT2 and a capacitor Cst are formed on a substrate 111. A switching thin film transistor TFT1, a gate line GL, a data line DL, and a driving voltage line DVL, and other wirings are also formed on the substrate 111.

Figure 13B:
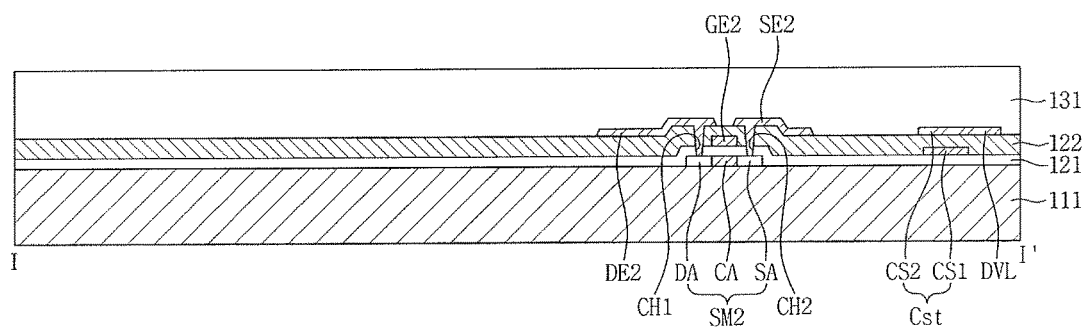

Referring to FIG. 13B, a photosensitive material is applied over an entire surface of the substrate 111, including the driving thin film transistor TFT2, to form a photosensitive material layer 131. The photosensitive material may use, for example, a photodegradable polymer resin. The photodegradable polymer resin may use, for example, a polyimide (PI) resin.

Referring to FIG. 13, a first pattern mask 301 is disposed above and spaced apart from the photosensitive material layer 131. The first pattern mask 301 includes a light blocking pattern 320 on a mask substrate 310. The light blocking pattern 320 includes at least three areas, each having different light transmittances. Such a first pattern mask 301 may also be referred to as a half tone mask. The mask substrate 310 may use a transparent glass or plastic substrate. In one embodiment, the mask substrate 310 may include a different material having light transmittance and mechanical strength.

The light blocking pattern 320 may be formed by selectively applying a light blocking material at the mask substrate 310. The blocking pattern 320 includes a light transmissive portion 321, a light blocking portion 322, and transflective portions 323 and 324. The light transmissive portion 321 is an area through which light is transmitted and is located above an area to be defined with a third contact hole CH3. The light blocking portion 322 is a portion at which light transmission is blocked and may be formed by applying a light blocking material to the mask substrate 310.

The transflective portions 323 and 324 are portions through which incident light is partially transmitted and is located above an area to be defined with recessed portions 210 and 220 and an area to be formed with a trench 711. For example, the transflective portions 323 and 324 may have a structure in which light transmissive areas 323a and 324a and light blocking slits 323b and 324b are alternately disposed. In such an exemplary embodiment, the light transmittance of the transflective portions 323 and 324 may be adjusted by adjusting a pitch between the light transmissive areas 323a and 324a and the light blocking slits 323b and 324b, respectively.

A transflective portion 323 may be located above the area to be defined with the recessed portions 211 and 212. A transflective portion 324 may be located above the area to be defined with the trench 711. The transflective portions 323 and 324 may have a substantially equal or different light transmittances. Depths of the recessed portions 211 and 212 and a depth of the trench 711 may be respectively adjusted by adjusting the light transmittance.

In order to define the recessed portions 211 and 212 having a small planar area, the transflective portion 323 may include only one light transmissive area 323a. In such an exemplary embodiment, the planar area and depth of the recessed portions 211 and 212 may be adjusted by adjusting a planar area of the light transmissive area 323a. In an exemplary embodiment, the light transmittance of the transflective portions 323 and 324 may be adjusted by adjusting a concentration of the light blocking material.

Figure 13C:
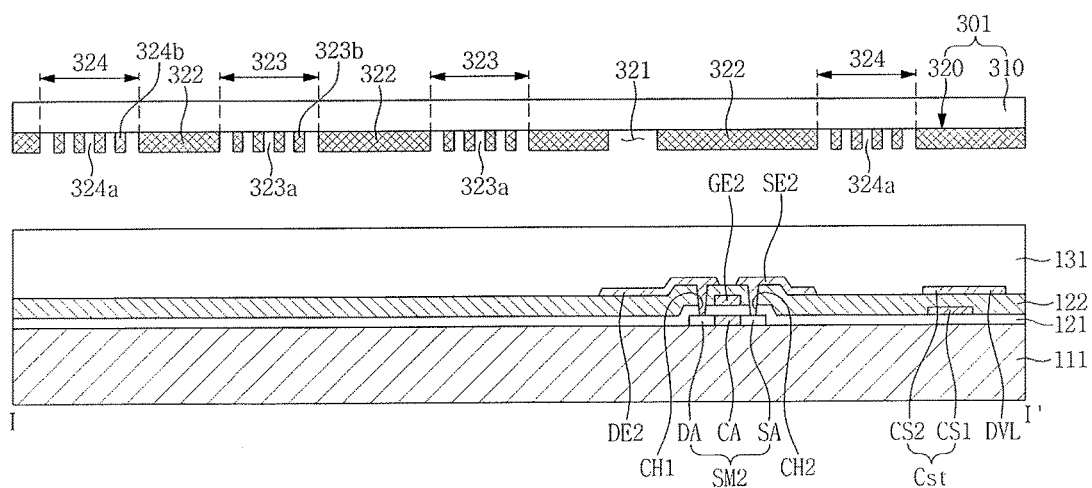
Figure 13D:
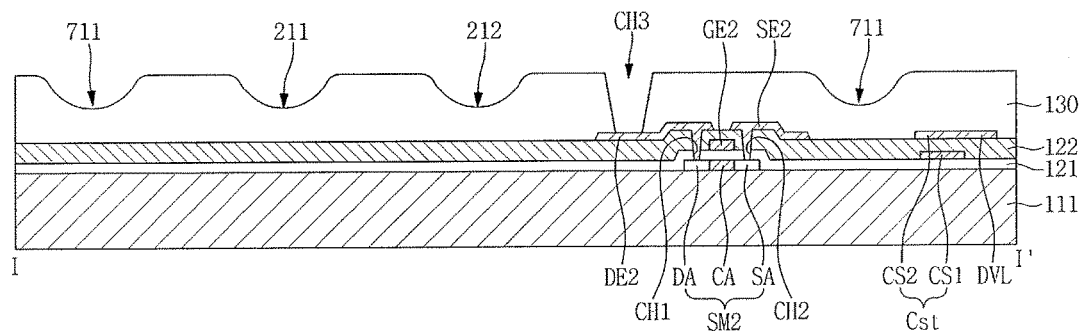

The photosensitive material layer 131 is patterned through exposure using the first pattern mask 301 illustrated in FIG. 13C, and a passivation layer 130 including the recessed portions 210 and 220 and the trench 711 is formed (see FIG. 13D).

For example, the photosensitive material layer 131 is exposed and then developed to form a pattern such as the recessed portions 210 and 220, the trench 711, and the third contact hole CH3. Referring to FIG. 13D, after exposure and development, the photosensitive material layer 131 is thermally cured to form the passivation layer 130. Polymeric resins forming the photosensitive material layer 131 partially flow in the thermal curing process to form gently curved recessed portions 210 and 220.

In an exemplary embodiment, when the polymer resin forming the photosensitive material layer 131 has fluidity during the thermosetting process of the photosensitive material layer 131 and the polymer resin flows to the recessed portions 211 and 212, the recessed portions 211 and 212 may be filled with the polymer resin to be buried. When the recessed portions 211 and 212 are filled, the depths of the recessed portions 211 and 212 may become shallow or the recessed portions 211 and 212 may disappear. When the depths of the recessed portions 211 and 212 become shallow or the recessed portions 211 and 212 disappear, the effect of substantially preventing color shift and WAD by virtue of the recessed portions 211 and 212 may also be reduced or dissipated.

However, according to an exemplary embodiment, the recessed portions 211 and 212 are substantially prevented from being filled by forming the trench 711 around a first electrode 171. For example, the polymer resin having fluidity in the thermosetting process of the photosensitive material layer 131 flows toward the trench 711 to substantially prevent the recessed portions 211 and 212 from being filled. Accordingly, pattern stability of the recessed portions 211 and 212 is ensured and the recessed portions 211 and 212 may have a predetermined depth and a predetermined width.

As described above, the trench 711 serves to maintain the pattern stability of the recessed portions 211 and 212 in the thermosetting process for forming the passivation layer 130.

Figure 13E:
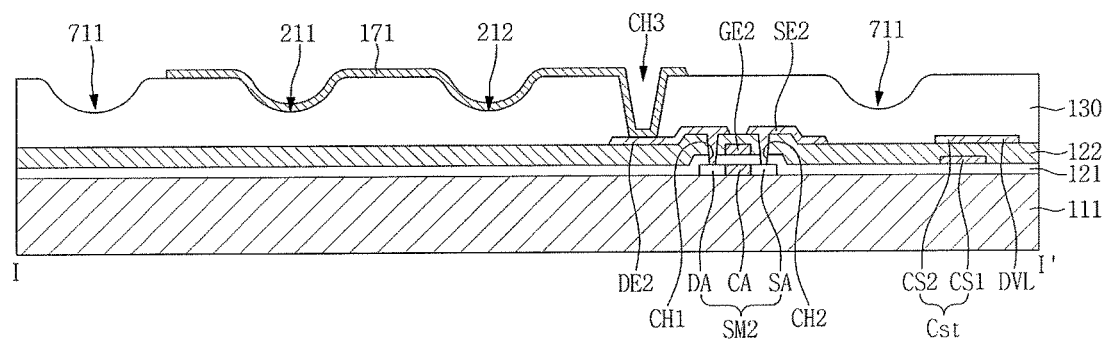

Referring to FIG. 13E, the first electrode 171 is formed on the passivation layer 130. The first electrode 171 is electrically connected to a second drain electrode DE2 through the third contact hole CH3. The first electrode 171 is also disposed at the recessed portions 211 and 212. However, the first electrode 171 is not disposed at the trench 711.

Figure 13F:
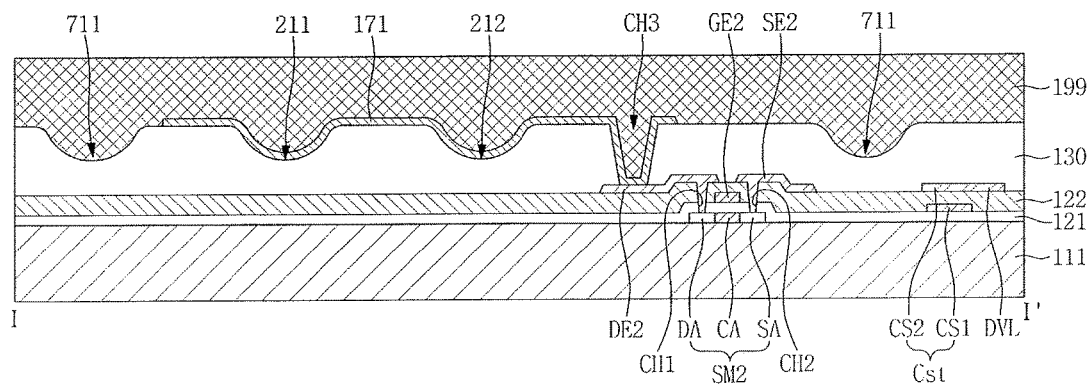

Referring to FIG. 13F, a photosensitive material layer 199 for forming a pixel defining layer is disposed on the substrate 111 including the first electrode 171 and the passivation layer 130. The photosensitive material layer 199 may include, for example, a photodegradable polymer resin. Such a photodegradable polymer resin may include, for example, at least one of a polyimide (PI) based resin, a polyacrylic resin, a PET resin and a PEN resin. According to an exemplary embodiment, the photosensitive material layer 199 includes a polyimide (PI) resin.

Figure 13G:
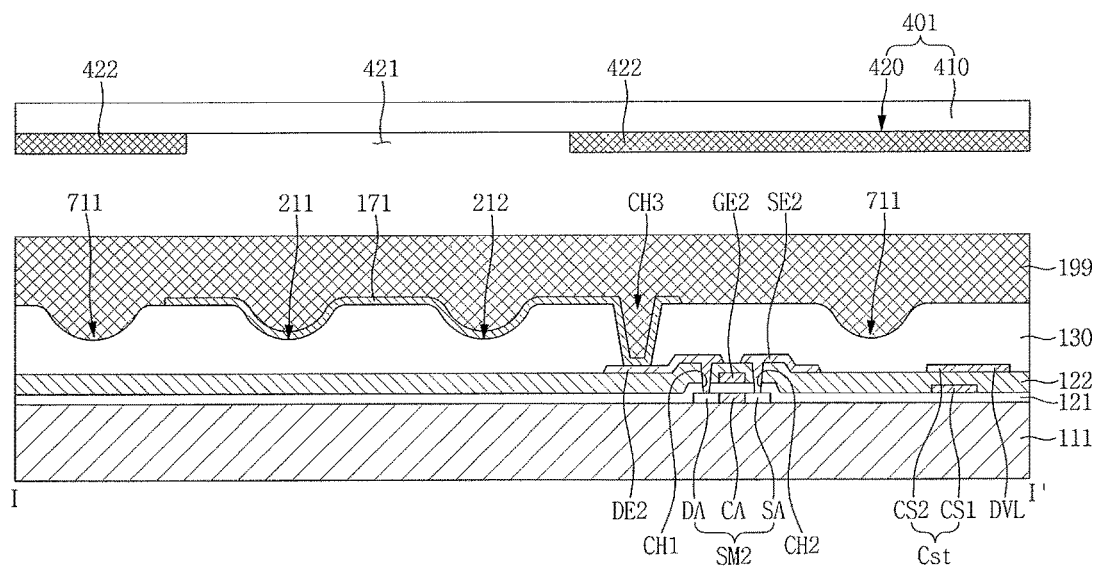

Referring to FIG. 13G, a second pattern mask 401 is disposed above the photosensitive material layer 199. The second pattern mask 401 includes a mask substrate 410 and a light blocking pattern 420 on the mask substrate 410. The mask substrate 410 may use a transparent glass or plastic substrate. The light blocking pattern 420 includes a light transmissive portion 421 and a light blocking portion 422.

The light transmissive portion 421 is a portion through which light is transmitted and is located above an area to be defined with an opening 195. The light blocking portion 422 is a portion where the transmission of light is blocked and is located above an area other than the area to be defined with the opening 195.

The photosensitive material layer 199 is patterned, for example, through a photolithography method using the second pattern mask 201 illustrated in FIG. 13G. For example, the photosensitive material layer 199 is exposed and then developed such that the opening 195 is defined.

Figure 13H:
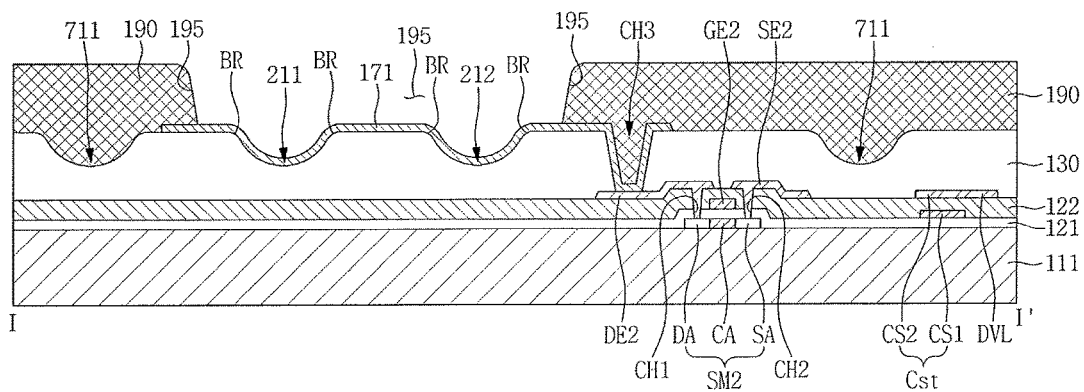

Referring to FIG. 13H, the patterned photosensitive material layer 199 is thermally cured such that a pixel defining layer 190 is formed. Polymeric resins forming the photosensitive material layer 199 may partially flow during the thermal curing process.

The opening 195 and an edge 191 of the opening 195 are defined by the pixel defining layer 190. The first electrode 171 is exposed from the pixel defining layer 190 by the opening 195. The pixel defining layer 190 exposes an upper surface of the first electrode 171 and protrudes along a circumference of the first electrode 171. The pixel defining layer 190 overlaps an end portion of the first electrode 171 and the opening 195 is located above the first electrode 171. In addition, the pixel defining layer 190 is disposed above the trench 711 so that an upper portion of the trench 711 becomes flat.

In an exemplary embodiment, the edge 191 of the opening 195 does not overlap the recessed portions 211 and 212. The edge 191 of the opening 195 is spaced apart from the recessed portions 211 and 212, e.g., an edge BR of the recessed portions 211 and 212 and the edge 191 of the opening 195 are spaced apart from each other.

When a pattern is formed through a photolithography method, and when the bottom surface of a boundary area of the pattern is not flat, it may be difficult to form a uniform pattern. According to an exemplary embodiment, a recessed portion or an uneven portion are not formed at the edge 191 of the opening 195, and the edge 191 of the opening 195 is located on a flat surface. Accordingly, the occurrence of pattern defects may be substantially prevented when forming the pixel defining layer 190.

Figure 13I:
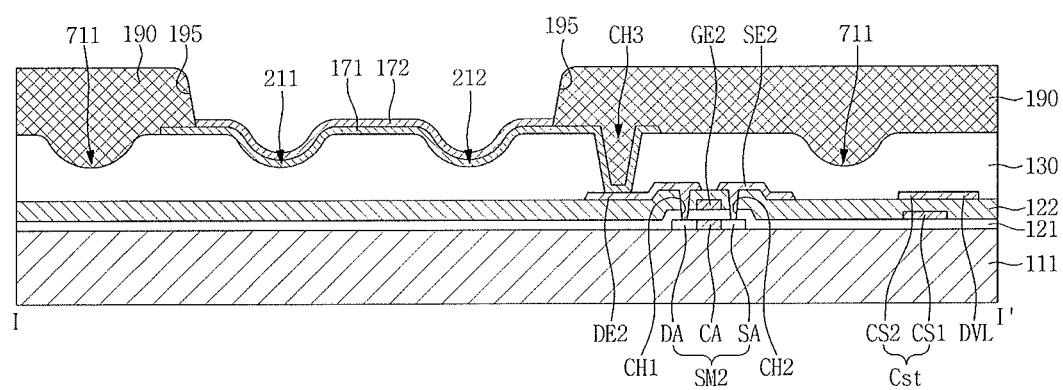

Referring to FIG. 13I, an organic light emitting layer 172 is formed on the first electrode 171 that is exposed by the opening 195 of the pixel defining layer 190. The organic light emitting layer 172 may be formed by deposition.

Figure 13J:
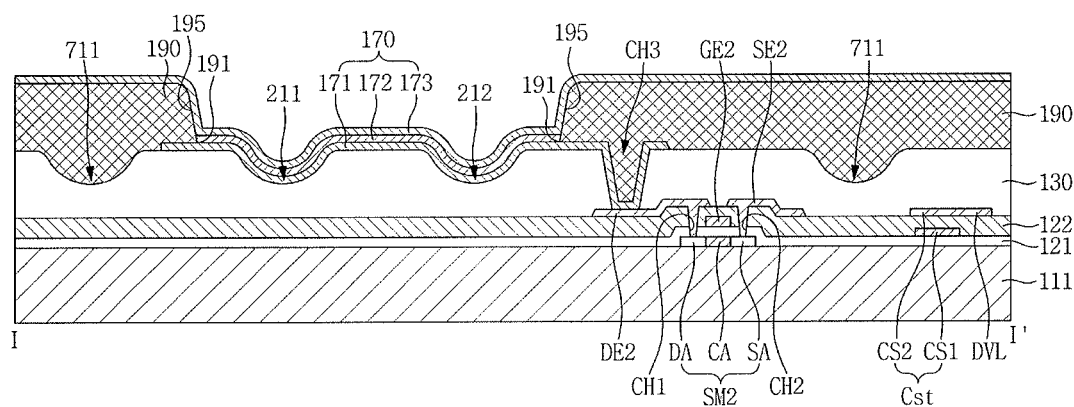

Referring to FIG. 13J, a second electrode 173 is formed on the organic light emitting layer 172. The second electrode 173 is also formed on the pixel defining layer 190. The second electrode 173 may be formed, for example, by deposition.

Figure 14A:
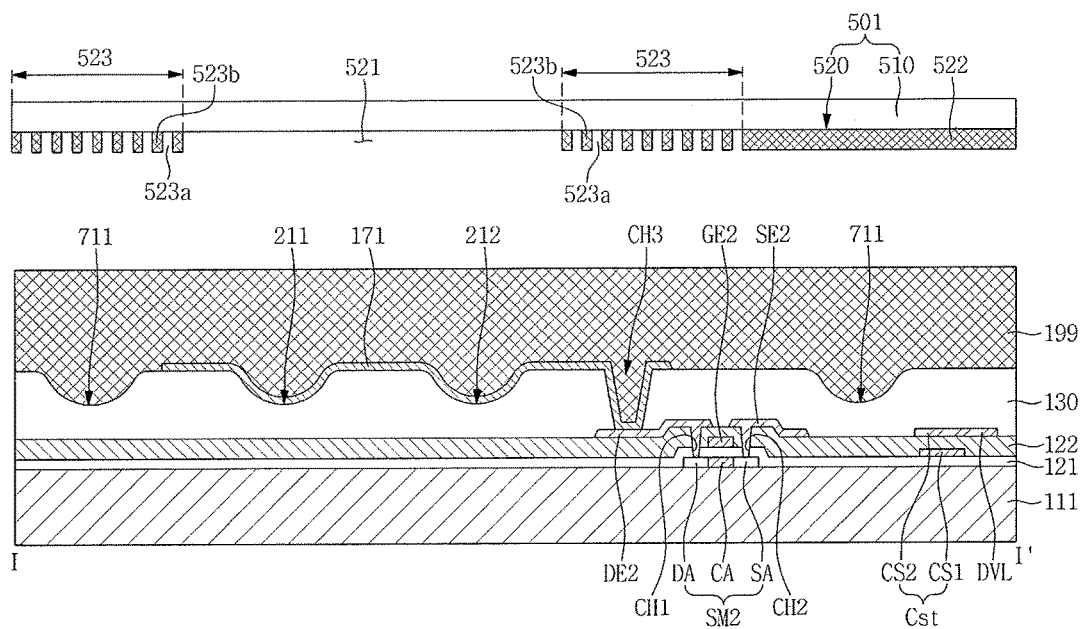
FIGS. 14A and 14B illustrate stages of another embodiment of a method for manufacturing an organic light emitting diode display device.
Figure 14B:
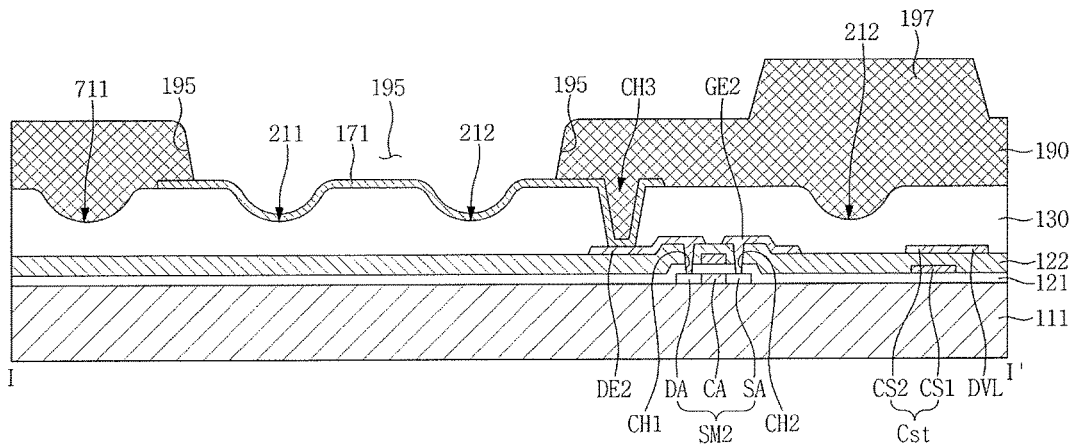

FIGS. 14A and 14B illustrate cross-sectional views of various stages of another embodiment of a method for manufacturing an OLED display device, which, for example, may be OLED display device 103. FIGS. 14A and 14B show a process of forming a pixel defining layer 190 and a spacer 197. The OLED display device 103 includes the spacer 197 on the pixel defining layer 190. The pixel defining layer 190 and the spacer 197 are unitarily formed through a substantially same process using a substantially same material.

Referring to FIG. 14A, a photosensitive material layer 199 for forming a pixel defining layer is disposed on a substrate 111 including a first electrode 171 and a passivation layer 130. A third pattern mask 501 is disposed above the photosensitive material layer 199.

The third pattern mask 501 includes a light blocking pattern 520 on a mask substrate 510. The light blocking pattern 520 includes a light transmissive portion 521, a light blocking portion 522, and a transflective portion 523. The light transmissive portion 521 is a portion through which light is transmitted and is located above an area to be defined with an opening 195. The light blocking portion 522 is a portion at which light transmission is blocked and is located above an area to be formed with the spacer 197.

The transflective portion 523 is a portion through which an incident light is partially transmitted and is located above an area other than the area to be defined with the opening 195 and the area to be formed with the spacer 197. Referring to FIG. 14A, the transflective portion 523 has a structure in which a light transmissive area 523*a* and a light blocking slit 523*b* are alternately arranged.

After the photosensitive material layer 199 is exposed and then developed by an exposure process using the third pattern mask 501, a pattern such as the opening 195 and the spacer 197 is formed.

Referring to FIG. 14B, the patterned photosensitive material layer 199 is thermally cured such that the pixel defining layer 190 and the spacer 197 are formed.

Subsequently, an organic light emitting layer 172 is disposed on the first electrode 171 and a second electrode 173 is disposed on the organic light emitting layer 172 and the pixel defining layer 190 to form an OLED 170 (e.g., see FIG. 12). In addition, a sealing member 150 is disposed on the OLED 170 and a filler 160 is disposed between the OLED 170 and sealing member 150 to form the OLED display device 103.

Figure 15:
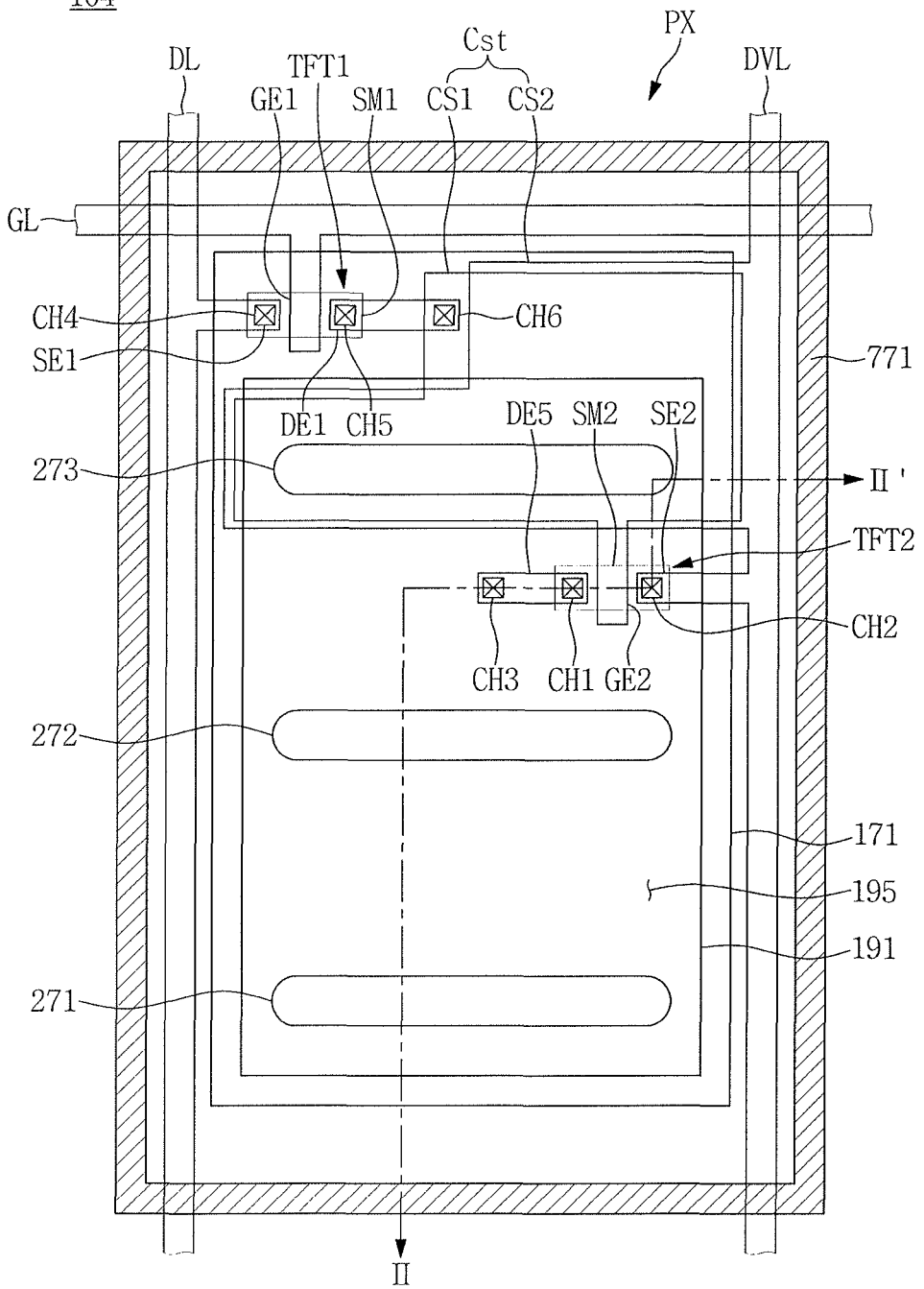
FIG. 15 illustrates another embodiment of a pixel.
Figure 16:
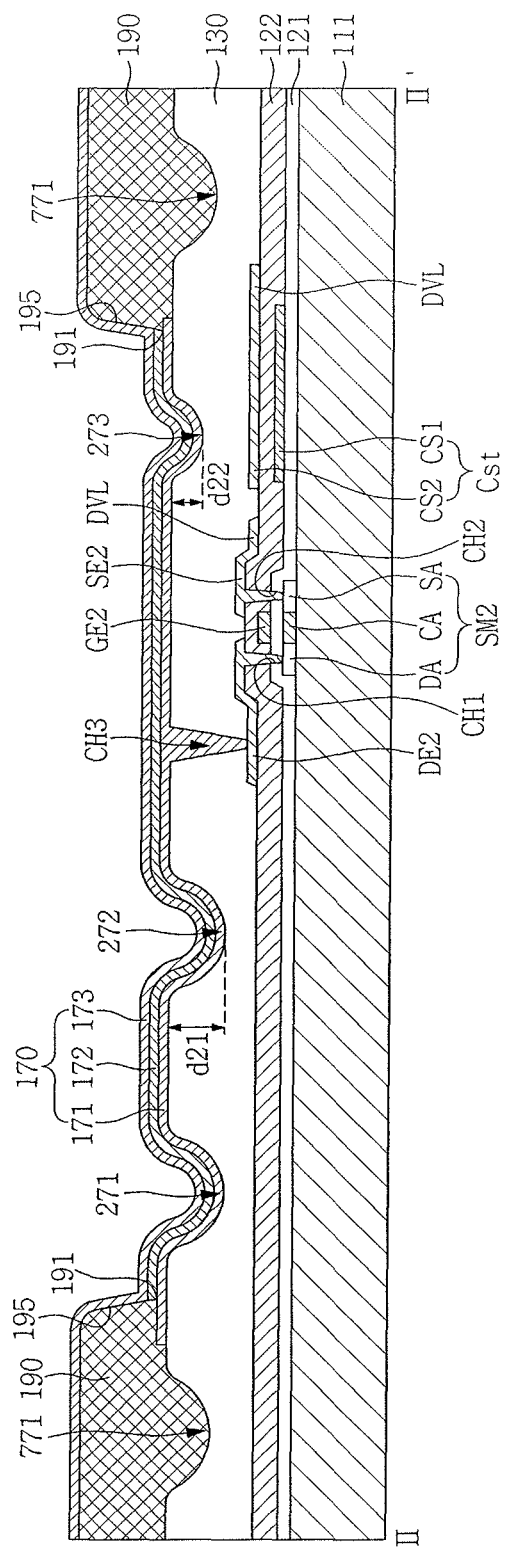
FIG. 16 illustrates a cross-sectional view taken along line II-II' in FIG. 15.

FIG. 15 illustrates a plan view of another embodiment of a pixel PX of an OLED display device 104. FIG. 16 illustrates a cross-sectional view taken along line II-II' in FIG. 15.

Referring to FIGS. 15 and 16, a passivation layer 130 includes a trench 771 and a plurality of recessed portions 271, 272, and 273. The trench 771 is around a first electrode 171 and encloses the first electrode 171 on a plane. The passivation layer 130 includes a first recessed portion 271, a second recessed portion 272, and a third recessed portion 273 in one pixel PX. The first recessed portion 271 and the second recessed portion 272 do not overlap a wiring therebelow which is disposed on an insulating interlayer 122 and the third recessed portion 273 overlaps a capacitor Cst.

The passivation layer 130 contacts the insulating interlayer 122 below the first recessed portion 271 and the second recessed portion 272, while the passivation layer 130 contacts a second capacitor plate CS2 below the third recessed portion 273. Accordingly, even though the first recessed portion 271 and the second recessed portion 272 are deep enough to expose the insulating interlayer 122, the first electrode 171 is not electrically connected to the wiring at the first recessed portion 271 and the second recessed portion 272.

When the third recessed portion 273 is deep such that the capacitor Cst is exposed from the passivation layer 130, the first electrode 171 may contact the second capacitor plate CS2 at the third recessed portion 273. When the first electrode 171 is connected to a wiring other than a second drain electrode DE2 of a driving thin film transistor TFT2, defects may occur in an OLED 170.

Accordingly, according to one exemplary embodiment, the recessed portions 271, 272, and 273 may have different depths depending on whether the respective recessed portions 271, 272, and 273 overlap wiring therebelow. For example, at least one of the two or more recessed portions may have a depth different from a depth of another of the recessed portions. For example, the third recessed portion 273 overlapping the wiring therebelow has a depth less than depths of the first and second recessed portions 271 and 272 not overlapping the wiring therebelow (d22<d21). In one embodiment, the depth d22 of the third recessed portion 273 overlapping the wiring therebelow is less than the depth d21 of the first and second recessed portions 271 and 272 not overlapping the wiring therebelow.

When the recessed portions 271, 272, and 273 having a narrow planar area, the depths of the recessed portions 271, 272, and 273 are related to widths of the recessed portions 271, 272, and 273. The depth of the recessed portion having a narrow planar area may be adjusted by adjusting an exposure area of a pattern mask used to form the recessed portion. For example, when the exposure area of the pattern mask is relatively large, a deep recessed portion may be defined.

According to one exemplary embodiment, one of the recessed portions 273 may have a width different from widths of others of the recessed portions 271 and 272.

Figure 17:
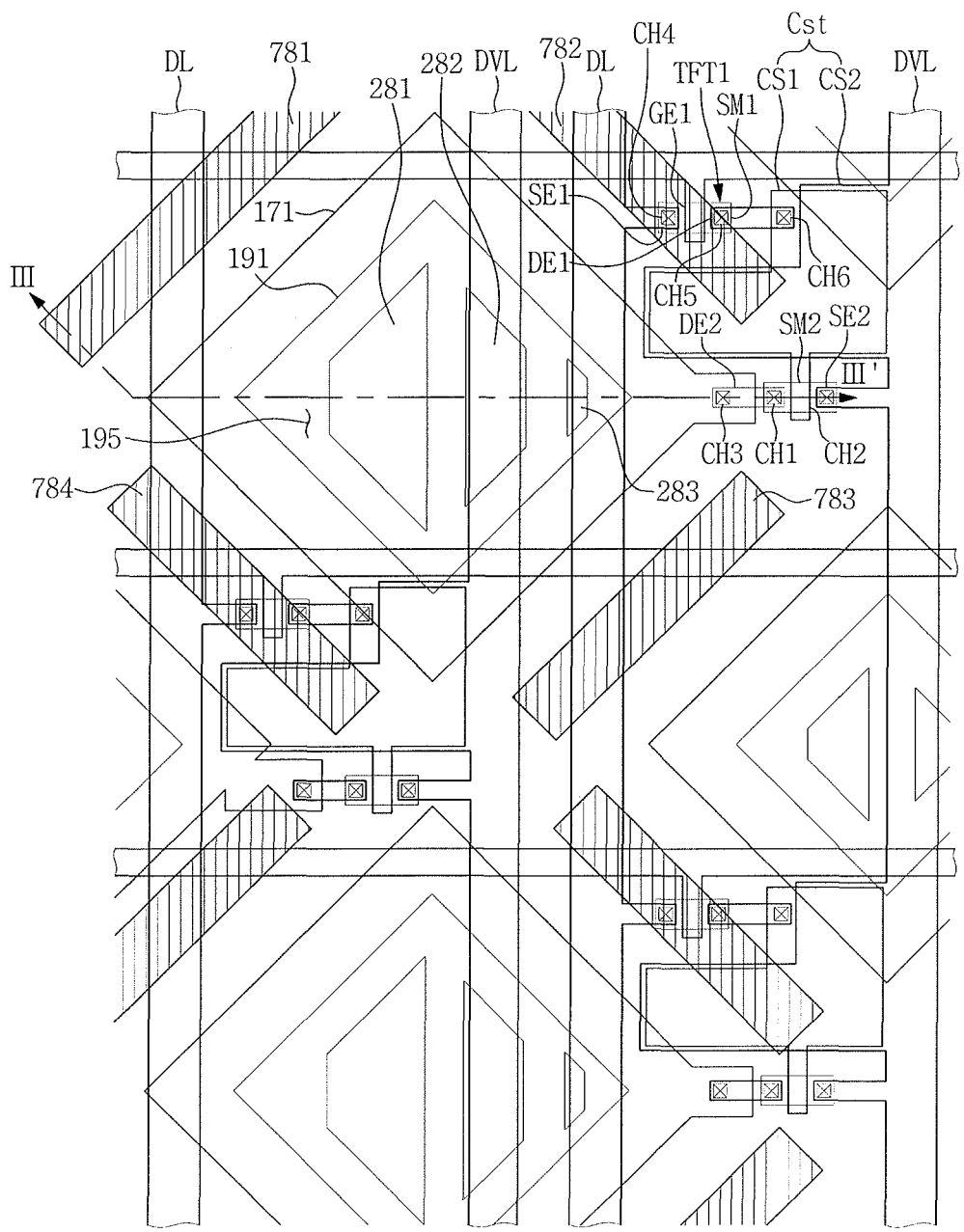
FIG. 17 illustrates another embodiment of a pixel.
Figure 18:
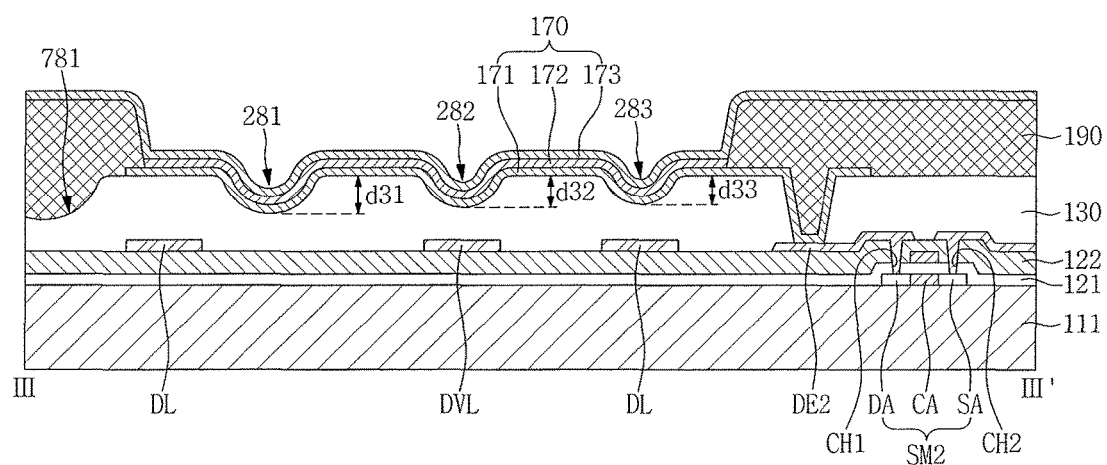
FIG. 18 illustrates a sectional view taken along line III-III' in FIG. 17.

FIG. 17 illustrates a plan view of another embodiment of a pixel of an OLED display device 105. FIG. 18 illustrates a sectional view along line of FIG. 17.

Referring to FIGS. 17 and 18, a passivation layer 130 includes a trench 781, 782, 783, and 784 and a plurality of recessed portions 281, 282, and 283.

Referring to FIG. 17, the recessed portions 281, 282, and 283 are arranged asymmetrically below a first electrode 171. For example, the passivation layer 130 includes a first recessed portion 281, a second recessed portion 282, and a third recessed portion 283 below one first electrode 171. A planar area of the first recessed portion 281 is greater than planar areas of the second recessed portion 282 and the third recessed portion 283. In such an exemplary embodiment, the first recessed portion 281 does not overlap a wiring on an insulating interlayer 122, the second recessed portion 282 overlaps a driving voltage line DVL, and the third recessed portion 283 overlaps a data line DL.

In order to substantially prevent the first electrode 171 from contacting the driving voltage line DVL at the second recessed portion 282, the second recessed portion 282 has a relatively small depth. For example, the depth d32 of the second recessed portion 282 overlapping the driving voltage line DVL is less than the depth d31 of the first recessed portion 281 not overlapping the driving voltage line DVL.

In order to substantially prevent the first electrode 171 from contacting the data line DL at the third recessed portion 283, the depth d33 of the third recessed portion 283 is less than the depth 31 of the first recessed portion 281 not overlapping data line DL.

Referring to FIG. 17, the trench 781, 782, 783, and 784 is around the first electrode 171. For example, the trench 781, 782, 783, and 784 may partially enclose the first electrode 171 without fully enclosing it. In one embodiment, the trench 781, 782, 783, and 784 encloses at least a part of the outside of the first electrode 171 on a plane.

The trench 781, 782, 783, and 784 may be in an area, for example, of about 50% or more of an area around the first electrode 171 on a plane. For example, assuming that there is one closed loop enclosing the first electrode 171, the trench 781, 782, 783, and 784 may be in an area of about 50% or more of the closed loop. In one embodiment, a ratio of a portion enclosed by the trench 781, 782, 783, and 784 to a circumference of the first electrode 171 is greater than a ratio of a portion not enclosed by the trench 781, 782, 783, and 784 to the circumference of the first electrode 171.

Referring to FIG. 17, the trench 781, 782, 783, and 784 includes a first recessed pattern 781, a second recessed pattern 782, a third recessed pattern 782, and a fourth recessed pattern 784 which are around the first electrode 171 and spaced apart from each other. The first recessed pattern 781, the second recessed pattern 782, the third recessed pattern 783, and the fourth recessed pattern 784 are not connected to each other, and each partially enclose the first electrodes 171. One recessed pattern 782, 783, and 784 may be between neighboring first electrodes 171 and one recessed pattern 782, 783, and 784 may serve as a common trench for the two neighboring first electrodes 171.

Figure 19:
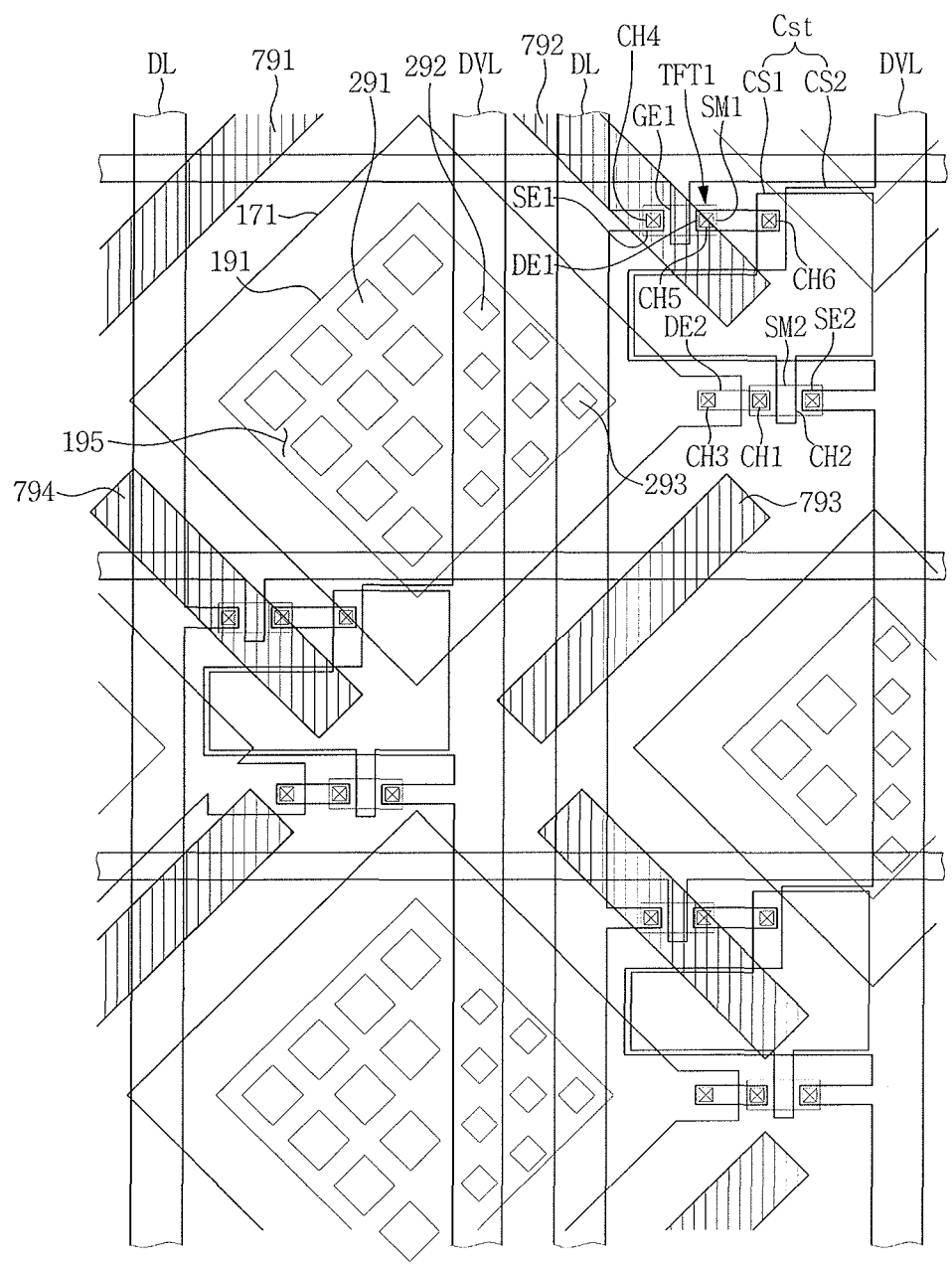
FIG. 19 illustrates another embodiment of a pixel.

FIG. 19 illustrates a plan view of another embodiment of a pixel of an OLED display device 106. Referring to FIG. 19, a plurality of recessed portions 291, 292, and 293 overlap one first electrode 171 and are defined at a passivation layer 130. At least one of the recessed portions 291, 292, and 293 has a size different from a size of another of the recessed portions 291, 292, and 293. For example, a first recessed portion 291 not overlapping a driving voltage line DVL or a data line DL has a planar area greater than planar areas of a second recessed portion 292 and a third recessed portion 293 overlapping the driving voltage line DVL or the data line DL.

The first recessed portion 291 having a relatively large planar area may have a depth greater than depths of the second recessed portion 292 and the third recessed portion 293 having relatively less planar areas.

The recessed portions 291, 292, and 293 may be defined, for example, by exposure using a pattern mask. In addition, the depths of the recessed portions 291, 292, and 293 may be adjusted, for example, by adjusting the size of an exposure area of the pattern mask used to form the recessed portions 291, 292, and 293.

Referring to FIG. 19, a trench 791, 792, 793, and 794 includes a first recessed pattern 791, a second recessed pattern 792, a third recessed pattern 793, and a fourth recessed pattern 794 around the first electrode 171. The first recessed pattern 791, the second recessed pattern 792, the third recessed pattern 793, and the fourth recessed pattern 794 are not connected to each other and each partially enclose first electrode 171.

In accordance with one or more of the aforementioned embodiments, an OLED display device includes a recessed portion and a trench which are formed at a passivation layer. The recessed portion serves to substantially prevent color shift depending on the viewing angle. The trench improves pattern stability of the recessed portion. Such an OLED display device has excellent display characteristics.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise indicated. Accordingly, various changes in form and details may be made without departing from the spirit and scope of the embodiments set forth in the claims.

What is claimed is:

1. An organic light emitting diode display device, comprising:
    a substrate;
    a passivation layer on the substrate and including a trench and a recessed portion;
    a first electrode on the passivation layer such that the passivation layer is between the substrate and the first electrode;
    a pixel defining layer on the passivation layer, the pixel defining layer defining an opening which exposes at least a part of the first electrode;
    an organic light emitting layer on the first electrode; and
    a second electrode on the light emitting layer,
    wherein the recessed portion is in an area bounded by edges of the opening and is spaced apart from the edges of the opening, and
    wherein the trench is spaced apart from the first electrode, the pixel defining layer being disposed above the trench.

2. The display device as claimed in claim 1, wherein the trench encloses at least a part of the first electrode.

3. The display device as claimed in claim 1, wherein the trench includes a plurality of recessed patterns spaced apart from each other and partially enclosing the first electrode.

4. The display device as claimed in claim 1, wherein the trench is spaced apart from the first electrode by a distance in a range from about 1 μm to about 5 μm.

5. The display device as claimed in claim 1, wherein the trench has a width in a range from about 1.0 μm to about 3.0 μm.

6. The display device as claimed in claim 1, wherein the trench has a depth in a range from about 0.2 μm to about 1.0 μm.

7. The display device as claimed in claim 1, wherein the passivation layer has substantially a same height with respect to a surface of the substrate at a boundary at which the passivation layer overlaps the pixel defining layer.

8. The display device as claimed in claim 1, wherein the passivation layer has a height difference of about 0.1 μm or less with respect to a surface of the substrate at a boundary at which the passivation layer overlaps the pixel defining layer.

9. The display device as claimed in claim 1, wherein the edge of the opening has substantially a same height with respect to a surface of the substrate.

10. The display device as claimed in claim 1, wherein the edge of the opening has a height difference of about 0.1 μm or less with respect to a surface of the substrate.

11. The display device as claimed in claim 1, wherein the recessed portion is spaced apart from the edge of the opening by a distance in a range from about 0.5 μm to about 5.0 μm.

12. The display device as claimed in claim 1, wherein at least a part of an edge of the recessed portion is parallel to the edge of the opening.

13. The display device as claimed in claim 1, wherein the recessed portion has a width in a range from about 1.0 μm to about 2.0 μm.

14. The display device as claimed in claim 1, wherein the recessed portion has a depth in a range from about 0.3 μm to about 0.7 μm.

15. The display device as claimed in claim 1, wherein the passivation layer includes a plurality of recessed portions.

16. The display device as claimed in claim 15, wherein each of the plurality of recessed portions has a linear planar shape.

17. The display device as claimed in claim 16, wherein the plurality of recessed portions are parallel to each other.

18. The display device as claimed in claim 15, wherein the plurality of recessed portions are arranged in a radial manner.

19. The display device as claimed in claim 15, wherein the plurality of recessed portions have different depths.

20. The display device as claimed in claim 15, further comprising:
    a thin film transistor between the substrate and the passivation layer; and
    one or more wirings connected to the thin film transistor,
        wherein at least one of the plurality of recessed portions overlaps the one or more wirings and wherein the recessed portion overlapping the one or more wirings has a depth less than a depth of a recessed portion not overlapping the one or more wirings.

21. The display device as claimed in claim 20, wherein the one or more wirings include a data line, a driving voltage line, and a capacitor.

22. The display device as claimed in claim 1, further comprising:
a spacer on the pixel defining layer.

23. A method for manufacturing an organic light emitting diode display device, the method comprising:
forming a photosensitive material layer by applying a photosensitive material layer on a substrate;
patterning the photosensitive material layer to form a passivation layer including a trench and a recessed portion;
forming a first electrode on the passivation layer such that the passivation layer is between the substrate and the first electrode;
forming a pixel defining layer on the passivation layer, the pixel defining layer defining an opening for exposing at least a part of the first electrode;
forming a light emitting layer on the first electrode; and
forming a second electrode on the light emitting layer,
wherein the recessed portion is in an area bounded by edges of the opening and is spaced apart from the edges of the opening, and
wherein the trench is spaced apart from the first electrode, the pixel defining layer being disposed above the trench.

24. The method as claimed in claim 23, wherein forming of the passivation layer includes thermally curing the patterned photosensitive material layer after patterning the photosensitive material layer.

25. The method as claimed in claim 23, wherein the recessed portion and the trench are defined in a same process.

26. The method as claimed in claim 23, wherein the first electrode is spaced apart from the trench by a distance in a range from about 1 µm to about 5 µm.

27. The method as claimed in claim 23, wherein the passivation layer has substantially a same height with respect to a surface of the substrate at a boundary at which the passivation layer overlaps the pixel defining layer.

* * * * *